US010282511B2

(12) United States Patent
Orvieto et al.

(10) Patent No.: US 10,282,511 B2
(45) Date of Patent: May 7, 2019

(54) METHOD FOR CREATING A PARAMETRIC PLANING HULL MODEL

(71) Applicant: Brunswick Corporation, Lake Forest, IL (US)

(72) Inventors: Andrew E. Orvieto, Rockledge, FL (US); Frederick C. Herrington, Cocoa Beach, FL (US); George B. Lewis, Satellite Beach, FL (US)

(73) Assignee: Brunswick Corporation, Lake Forest, IL (US)

( * ) Notice: Subject to any disclaimer, the term of this patent is extended or adjusted under 35 U.S.C. 154(b) by 1088 days.

(21) Appl. No.: 14/274,280

(22) Filed: May 9, 2014

(65) Prior Publication Data

US 2015/0321728 A1  Nov. 12, 2015

(51) Int. Cl.
*G06F 17/50* (2006.01)
*B63B 9/00* (2006.01)
*B63B 1/20* (2006.01)

(52) U.S. Cl.
CPC .......... *G06F 17/5086* (2013.01); *B63B 9/001* (2013.01); *G06F 17/5004* (2013.01); *B63B 2001/201* (2013.01)

(58) Field of Classification Search
None
See application file for complete search history.

(56) References Cited

U.S. PATENT DOCUMENTS

| 5,351,641 A | 10/1994 | Robson |
| 6,394,014 B1 | 5/2002 | Waldock |
| 6,564,737 B2 | 5/2003 | Skira |
| 7,201,111 B1 * | 4/2007 | Burkett ................... B63B 1/042 114/271 |
| 2003/0074114 A1 | 4/2003 | Okuyama et al. |

OTHER PUBLICATIONS

Lee et al., Development of a semantic product modeling system for initial hull structure in shipbuilding, 2004, Elsevier, pp. 211-223.*
Kerns, Naval Ship Design and Synthesis Model Architecture Using a Model-Based Systems Engineering Approach, 2011, Virginia Polytechnic Institute and State University, pp. 1-189.*
New Wave Systems, ProSurf 3 and Rhino 3D, May 2006, New Wave Systems, Inc., pp. 1-7.*
ESI Group, Multiple CAD Systems, 2017, ESI Group, pp. 1-3.*

(Continued)

*Primary Examiner* — Aniss Chad
*Assistant Examiner* — Bernard E Cothran
(74) *Attorney, Agent, or Firm* — Andrus Intellectual Property Law, LLP

(57) ABSTRACT

A method for creating a parametric planing hull model is disclosed. In one embodiment, dimensions of a plurality of hull sections, including two non-adjacent hull sections, are received from a user. Dimensions of at least one hull section between the two non-adjacent hull sections are interpolated. Curves of the hull are generated based on the dimensions of the plurality of hull sections received from the user and the interpolated dimensions of the at least one hull section between the two non-adjacent hull sections. Surfaces of the hull are created based on the generated curves, and a planing hull model is generated from the created surfaces and is displayed.

21 Claims, 30 Drawing Sheets

(56) References Cited

OTHER PUBLICATIONS

Narrowboat & Canal Boat Information, Definition of Chine, 2017, Narrowboat & Canal Boat Information, p. 1.*
Lewis, Principles of Naval Architecture, May 1988, The Society of Naval Architects and Marine Engineers, vol. 2, pp. 1-327.*
Varela, et al., Product data model of hull structures and digital prototyping system for basic structural design, 2011, Taylor & Francis, vol. 6 Nos. 1-2, pp. 3-14.*
Calkins et al., An automated computational method for planing hull form definition in concept design, 2001, Elsevier Science, pp. 297-327.*
International Preliminary Report on Patentability, PCT/US2015/028547, dated Nov. 15, 2016, 7 pp.
International Search Report and Written Opinion for PCT/US2015/28547 dated Aug. 4, 2015, 15 pages.
Orca3D Talk!, Orca3D Hull Assistant, http://orca3d.com/forum/index.php?topic=27.0, 3 pages, Jul.-Dec. 2008.
FastShip Basic Ship Design, http://www.proteusengineering.com/fastship.htm, 8 pages, 2010.
Autoship Hull Design & System Modelling, http://cadcam.autoship.com/cadproductsservices/autoship/autoship.htm, 3 pages, printed May 2014.
Maxsurf—3D Hull, Superstructure and Appendage Modeling, http://www.formsys.com/maxsurf/msproducts/maxsurf, 3 pages, printed May 2014.
Orca3D Hull Design & Fairing, http://orca3d.com/Orca3dJ/index.php/modules/hull-design-a-fairing, 2 pages, printed May 2014.
Rhino Grasshopper, AEC Magazine, http://aecmag.com/index.php?option=com_content&task=view&id=293&Itemid=32, 3 pages, Sep. 2013.
Rhino Grasshopper, AEC Magazine, http://grasshopper3d.com, 1 page, printed May 2014.
Rhinocerous, http://rhino3d.com, 1 page, printed May 2014.
Orca3D User Manual, Version 1.3, 367 pages, Jun. 2013.
Maxsurf, Window Version 16, User Manual, 265 pages, 1984-2011.
M-Hull: An Interactive Graphics Hull Design Program, User's Manual, 153 pages, Feb. 1991.
Parametric Generation of Yacht Hulls, Marcus Bole, University of Strathclyde, 123 pages, 1997.
Integrating Parametric Hull Generation into Early Stage Design, Marcus Bole, Ship Technology Research, vol. 53, pp. 115-137, 2006.
A Parametric Approach for Initial Hull Form Modeling Using NURBS Representation, Nam and Parsons, Journal of Ship Production, pp. 76-89, May 2000.
Development of an Innovative Surface Design Tool, Charles Forrest, 15 pages, 2005.
Effect of Tunnel on the Resistance of High-Speed Planing Craft, Journal of Navel Architecture and Marine Engineering, 14 pages, Jun. 2005.
Design of Propeller Tunnels for High-Speed Craft, Blount and Associates, Inc., 14 pages, 1993.
An Automated Computational Method for Planing Hull Form Definition in Concept Design, Calkins et al., Ocean Engineering 28, pp. 297-327, 2001.

* cited by examiner

Figure 2

| Station | 0 | 1 | 2 | 3 | 4 | 5 | 6 | 7 | 8 | 9 | 10 |
|---|---|---|---|---|---|---|---|---|---|---|---|
| Gunwale Beam | 36.00 | 36.36 | 36.80 | 37.33 | 37.80 | 38.00 | 37.69 | 36.53 | 34.18 | 30.40 | 24.01 |
| Chine Beam | 32.00 | 32.00 | 32.00 | 31.98 | 32.00 | 32.00 | 31.32 | 29.07 | 24.13 | 15.00 | |
| Inner Chine Beam | 28.00 | 28.00 | 28.00 | 27.98 | 28.00 | 28.00 | 27.34 | 25.22 | 20.74 | 12.71 | |
| Deadrise | 21.00 | 20.89 | 21.00 | 21.77 | 22.87 | 24.40 | 28.29 | 35.06 | 41.71 | 43.10 | |
| Twist | 0.00 | -0.11 | 0.00 | 0.77 | 1.87 | 3.40 | 7.29 | 14.06 | 20.71 | 22.10 | |
| | | | | | | | | | | | |
| Chine Beam / Max Chine Beam | 1.00 | 1.00 | 1.00 | 1.00 | 1.00 | 1.00 | 0.98 | 0.91 | 0.75 | 0.47 | |
| Inner Chine Beam / Max Chine Beam | 0.87 | 0.87 | 0.87 | 0.87 | 0.87 | 0.87 | 0.85 | 0.79 | 0.65 | 0.40 | |

| | |
|---|---|
| Planing Area | 14458.92 |
| Planing Area Centroid | 112.90 |
| Projected Chine Length | 262.08 |
| Max Chine Beam | 64.07 |
| Chine Length / Chine Beam | 4.09 |
| Stem Rake | 30.38 |
| Hull Surface Area | 35194.54 |

Figure 34

METHOD FOR CREATING A PARAMETRIC PLANING HULL MODEL

BACKGROUND

Planing hulls are complex surfaces that are often difficult to model. Creating planing hull models often requires advanced free-form modeling skills and typically requires at least a partial lines plan from a naval architect. Within the typical design spiral, a hull design must be analyzed for hydrostatics, resistance, and a variety of other metrics. Changes are made to the hull design based on the results of these analyses until a final design is created that adequately satisfies the project requirements. While it is possible to estimate initial performance characteristics based on empirical results and regression values of similar vessels, a hull model is necessary for detailed analysis.

Computer software applications are available that can generate a planing hull model from basic information inputted from a user on the overall parameters of the hull. For example, a 3D modeling software program called Rhinoceros uses Non-Uniform Rational B-Splines (NURBS) methods for generating curves and surfaces. It is widely accepted as an extremely capable freeform modeling program and has become quite popular in the marine industry. Orca3D is a naval architecture plug-in for Rhinoceros. Orca3D includes a Planing Hull Assistant module for creating parametric planing hulls. Hull creation using Orca3D's Planing Hull Assistant is based on relative parameters rather than absolute dimensional values. The Planing Hull Assistant allows the user to adjust the chine of a planing hull transversely or vertically but does not allow for the input of specific values (e.g., chine beam, deadrise, etc.) in the forward sections of the hull. This does not give the hull designer the explicit control they need in these areas. The user is unable to create additional features like secondary chines without additional manual input. In addition, the user is unable to set the angle of the chines. Also, the Planing Hull Assistant is limited in the variety of planing hull types that it can produce.

SUMMARY

The present invention is defined by the claims, and nothing in this section should be taken as a limitation on those claims.

By way of introduction, the embodiments described below provide a method for creating a parametric planing hull model. In one embodiment, dimensions of a plurality of hull sections, including two non-adjacent hull sections, are received from a user. Dimensions of at least one hull section between the two non-adjacent hull sections are interpolated. Curves of the hull are generated based on the dimensions of the plurality of hull sections received from the user and the interpolated dimensions of the at least one hull section between the two non-adjacent hull sections. Surfaces of the hull are created based on the generated curves, and a planing hull model is generated from the created surfaces and is displayed. Other embodiments are disclosed, and each of the embodiments can be used alone or together in combination.

The embodiments will now be described with reference to the attached drawings.

BRIEF DESCRIPTION OF THE DRAWINGS

FIG. 2 is an illustration of exemplary inputs and outputs of a method of an embodiment.

FIG. 34 is an illustration of an offsets file output of an embodiment.

DETAILED DESCRIPTION OF THE PRESENTLY PREFERRED EMBODIMENTS

Introduction

By way of overview, the embodiments described below relate to a method and system for creating a parametric planing hull model with multiple hard chines. In one presently preferred embodiment, the method is implemented as a computer program (sometimes referred to herein as "BBGHull") that runs within Grasshopper, which is a currently-available, free plug-in for a 3D modeling software program called Rhinoceros. Grasshopper provides an intuitive user-interface and robust Non-Uniform Rational B-Splines (NURBS) geometry methods. The hull models can remain in Grasshopper or be brought into Rhinoceros for further development. Of course, this is just one particular implementation, and other implementations can be used. Accordingly, the claims should not be limited to the use of a particular computer program unless expressly recited therein.

Exemplary Method

Figure 1:
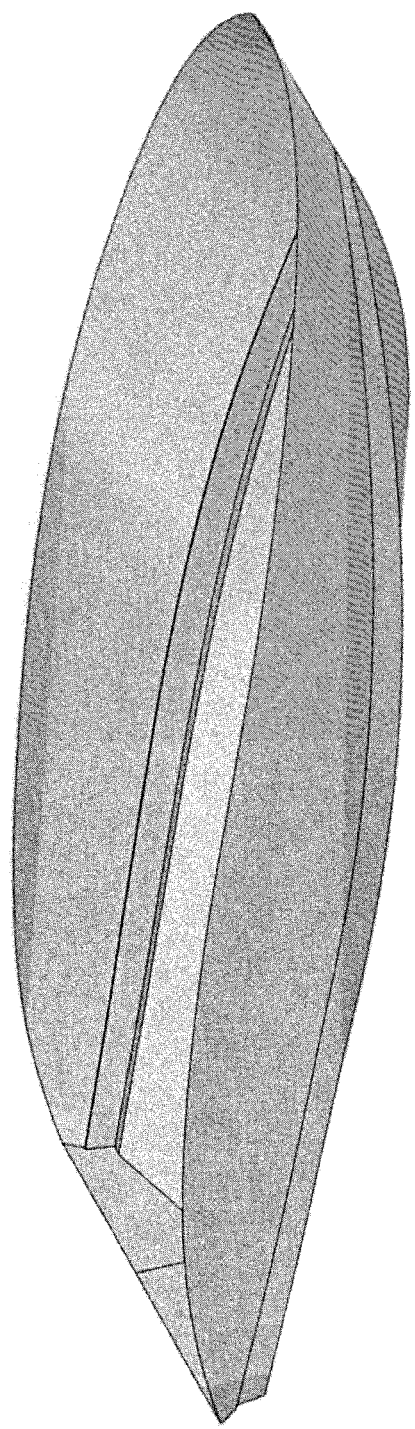
FIG. 1 is an illustration of a planing hull model of an embodiment.

In one embodiment, a computerized method for creating a planing hull model is provided that receives dimensions of a plurality of hull sections for a user, where the plurality of hull sections include two (preferably three) non-adjacent hull sections. The software interpolates dimensions of at least one boat hull section between the two non-adjacent hull sections and then generates curves of the hull based on the inputted dimensions and the interpolated dimensions. The use of both the user-provided dimensions and the interpolated dimensions results in better generated curves than if just user-provided dimensions were used, which provides an advantage over prior solutions. The software creates surfaces of the hull based on the generated curves and then uses the created surfaces to generate a planing hull model (such as the model shown in FIG. 1) and displays it to the user.

Figure 2:
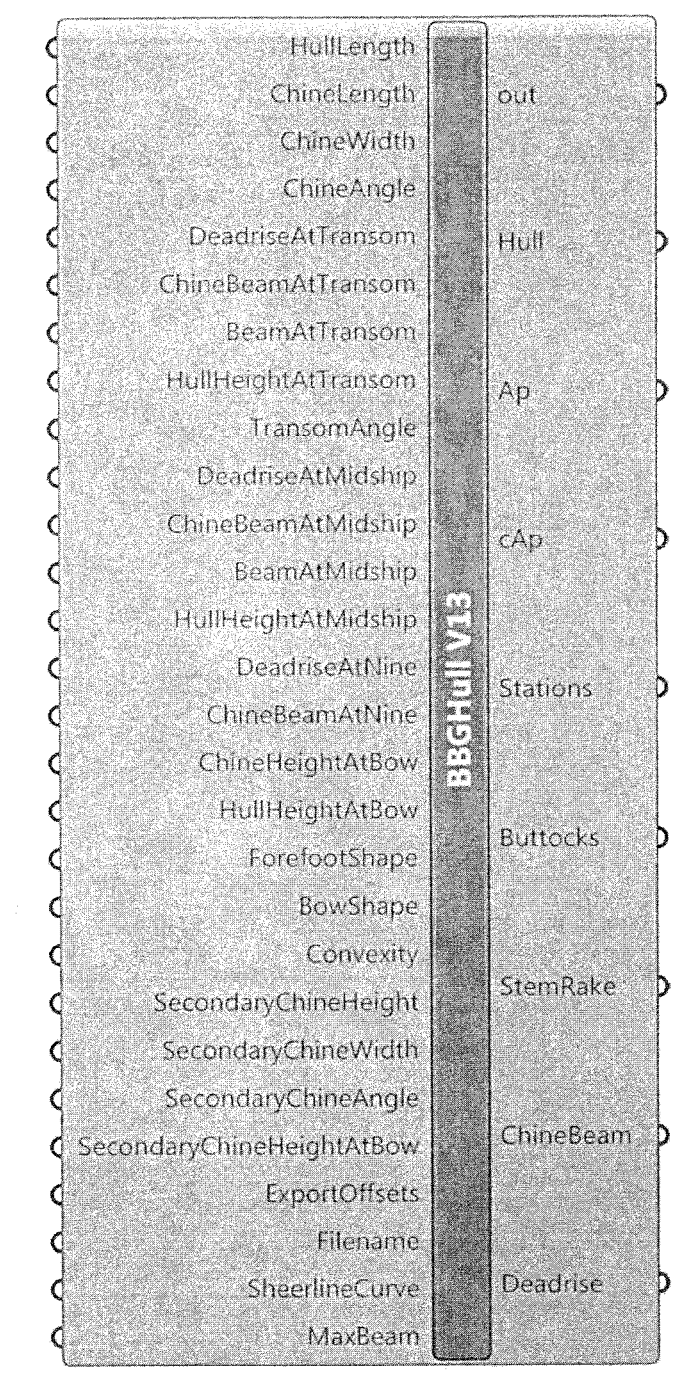
Figure 3:
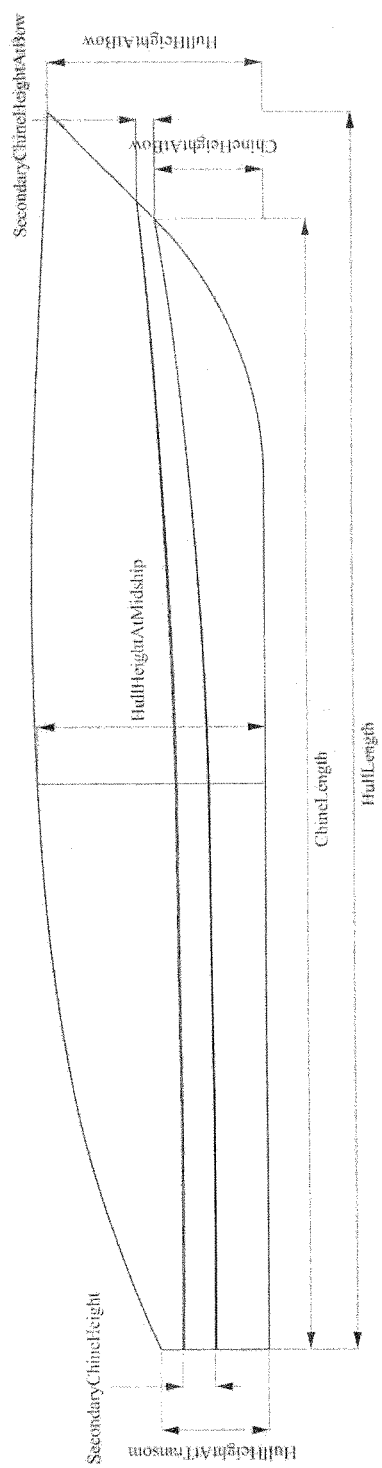
FIG. 3 is a profile view showing exemplary dimensional inputs of an embodiment.
Figure 4:
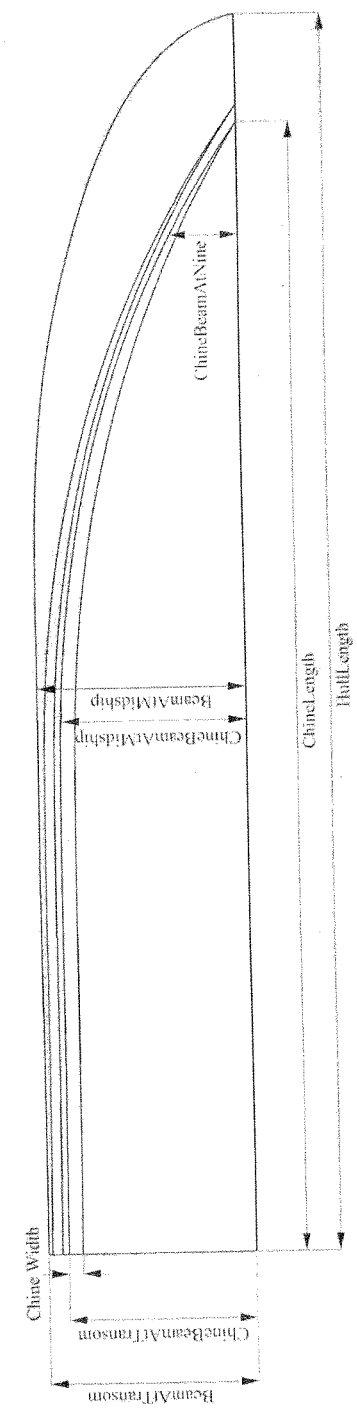
FIG. 4 is a plan view showing exemplary dimensional inputs of an embodiment.

FIG. 2 shows exemplary user inputs that can be used in these embodiments. Of course, these are only examples, and different inputs can be used. In this particular embodiment, the inputs include: hull length, chine length, chine width, chine angle, deadrise at the transom, chine beam at the transom, beam at the transom, hull height at the transom, transom angle, deadrise at midship, chine beam at midship, beam at midship, hull height at midship, deadrise at section 9, chine beam at section 9, chine height at section 9, chine height at the bow, hull height at the bow, forefoot shape, bow shape, convexity, secondary chine height, secondary chine width, secondary chine angle, secondary chine height at the bow, export offsets, file name, sheerline curve, and maximum beam. FIGS. 3 and 4 are profile and plan views that illustrate some of these dimensional inputs.

The chine angle is defined as the angle between the chine flat and the Y-axis. This angle carries forward from the transom and blends back to 0° at the bow. The secondary chine angle is defined as the angle between the secondary chine vertical surface and the Z-axis. This angle carries forward from the transom over the length of the secondary chine curve. The Transom Angle input allows the user to create hulls with angled transom surfaces. The transom angle is defined as the angle between the transom surface and the vertical axis from the transom/keel intersection. If an angle is introduced, the sheerline curve automatically adjusts in profile to match the tangency of the transom. This allows a user to change the transom angle based on the propulsion selected for the vessel. Hulls can be created which accommodate multiple propulsion options, including inboards, pod drives, stern drives, or outboards. The forefoot shape parameter defines the radius of the fillet arc between the baseline and the bow rake line. A Forefoot Shape value of 0 equates to a sharp discontinuity at the bow/keel intersection.

Bow shape, export offsets, filename, and sheerline curve are non-dimensional inputs. The bow shape parameter defines the tangent of the final interpolate point on the sheerline curve. The values for this parameter vary between 0 and 1. A value of 0 equates to a tangent line in the negative Y-direction, giving the hull a fuller, more rounded bow from a plan view. A value of 1 changes the tangent line to give the boat a more pointed bow in a plan view. Export offsets accepts a Boolean value of True or False, with False being the default value. If the user inputs True, the offsets of the hull will be exported as a .CSV file which can be opened in Microsoft Excel. The offsets file includes a labeled table of numerical values corresponding to the Hull Beam, Chine Beam, Inner Chine Beam, Deadrise, and Twist (variation of deadrise with respect to the transom) at each of the eleven stations. Filename accepts a string corresponding to the desire name of the offsets file. The software application appends the appropriate file extension to this string when export offsets has been triggered. Sheerline curve accepts a curve corresponding to the desired sheerline shape. The software application maps this source curve to the desired dimensional domain and the resulting hull will have the same sheerline shape as the input curve. If no curve is input, the program will use the dimensional outputs to create a smooth sheerline without discontinuities.

Regarding outputs, these include the boat hull model, planing area (Ap) and planing area centroid (cAp), sections, buttocks, stem rake, chine beam, and deadrise. As will be explained in more detail below, the boat hull model is created as single boundary representation. Individual surfaces are joined together before being output, and the hull becomes a joined polysurface. The surface normal vectors automatically point outwards, ensuring that hydrostatics simulations can be run. The planing area ($A_p$) is the area of the hull's running surface bounded by the chines. This area is created by projecting the area bound by the chine curves and the transom onto the XY plane. The planing area output is an area value in the current units. The planing area is used to determine the vessel's bottom loading, an effective measure of its planing performance. The Planing Area Centroid ($cA_p$) output corresponds to the longitudinal position of the centroid of the planing area forward of the transom/keel intersection. This output is of particular importance in the determining the desired placement of the finished vessel's longitudinal center of gravity (LCG). Proper placement is related to the projected chine length and the planing area centroid. LCG placement is crucial in a planing vessel and requires the naval architect's attention throughout the design process. Stations are section curves in the XZ plane. The program outputs joined curves at each of 11 stations beginning at the transom/keel intersection and ending at the chine/stem intersection. These curves used by the naval architect as a means of assessing hull fairness and visualizing changes in the hull over its length. Buttocks are section curves in the YZ plane. The program outputs 4 buttock curves, evenly spaced over the half chine beam. Of particular interest to the naval architect is the quarter buttock, located at ¼ of the maximum chine beam. The buttock lines give the naval architect insight into the fairness of the hull and its variation across its beam. Hull offsets are a table of offsets that allows the naval architect to easily evaluate chine beam and deadrise and compare these distributions to those of established models with known performance characteristics. The StemRake output gives the angle (in degrees) of the rake of the stem of the hull compared to the local vertical axis. The user can effectively control the rake angle of the stem using the HullLength, ChineLength, HullHeightAtBow, and ChineHeightAtBow inputs. The ChineBeam output gives a list of the deadrise values at each station of the hull. These values are often used as a means of comparing multiple vessels and their respective chine beam distributions. The Deadrise output gives a list of the deadrise values at each station of the hull. These values are often used as a means of comparing multiple vessels and their respective deadrise distributions.

Figure 5:
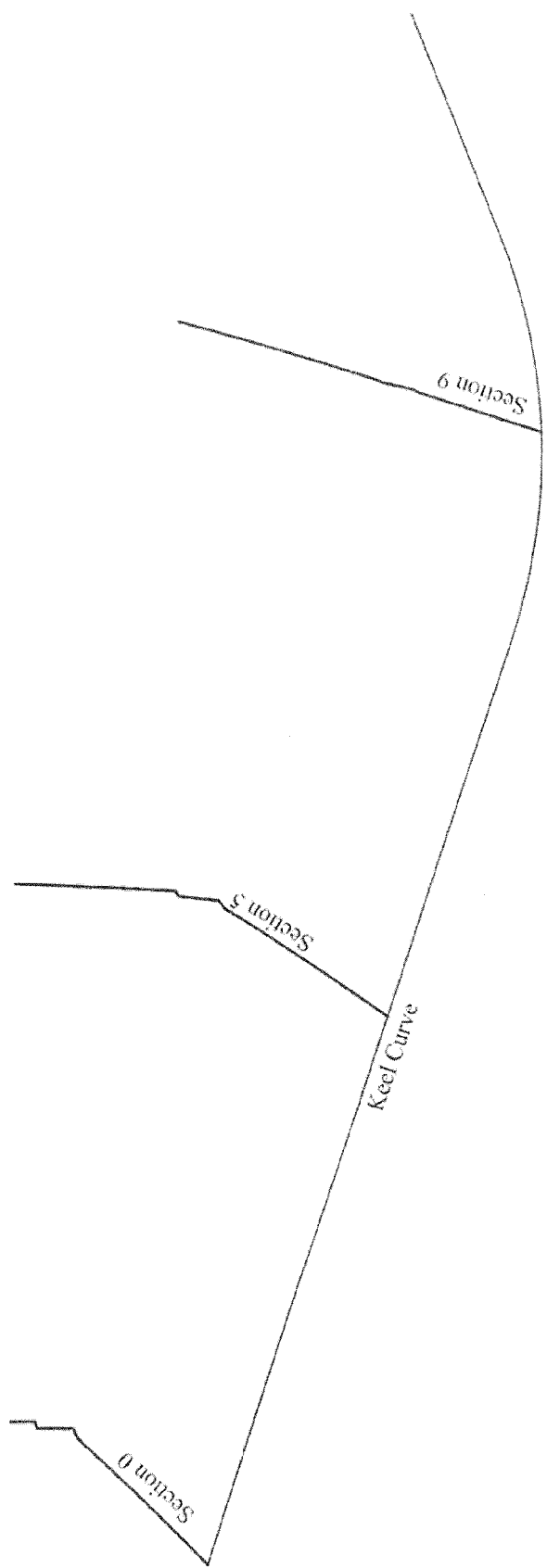
FIG. 5 is an illustration of a keel curve created by a hull modeling method of an embodiment from user inputs of sections 0, 5, and 9.

As mentioned above, the software application in this embodiment receives dimensions of a plurality of boat hull sections from a user, including two (preferably three) non-adjacent boat hull sections. In this way, a user can control what the hull will look like in plan, profile, and section views. FIG. 5 shows the user inputs pertaining to the hull profile. The use of section (sometimes referred to as "stations") is based on the underlying curve structure from which all hull surfaces are developed. This particular embodiment uses non-uniform rational B-splines (NURBS) routines for generating curves and surfaces, where the user inputs correspond to a series of NURBS interpolation curves that form the underlying curve structure from which the finished hull surface is created. The curve structure is based on the use of eleven section curves, or stations. These curves are spaced evenly over the chine length of a hull, beginning with Station 0 at the transom/keel intersection and ending with Station 10 at the chine/stem intersection. Half sections are used for simplicity.

Figure 6:
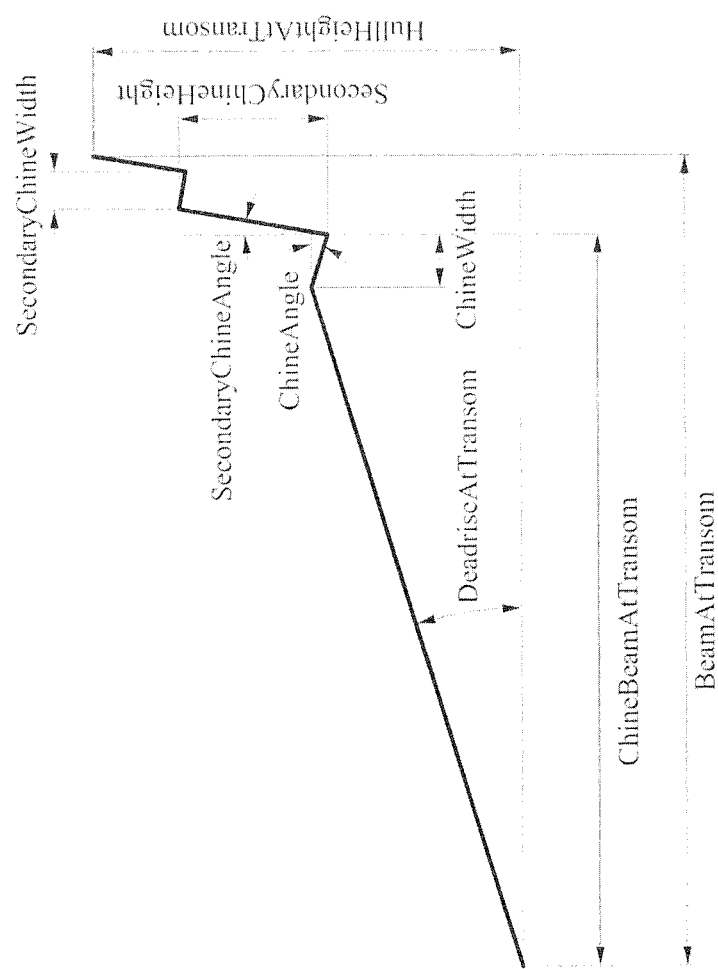
FIG. 6 is an illustration of exemplary section 0 dimensions, which are inputted into a hull modeling method of an embodiment.
Figure 7:
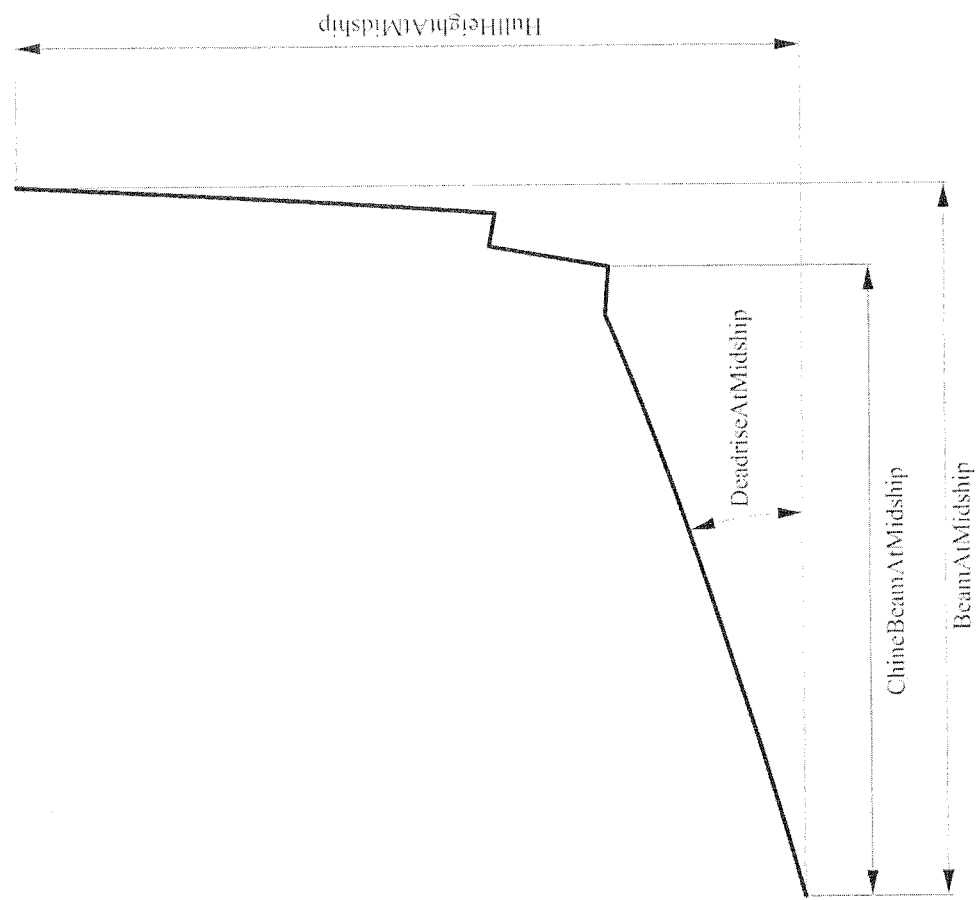
FIG. 7 is an illustration of exemplary section 5 dimensions, which are inputted into a hull modeling method of an embodiment.
Figure 8:
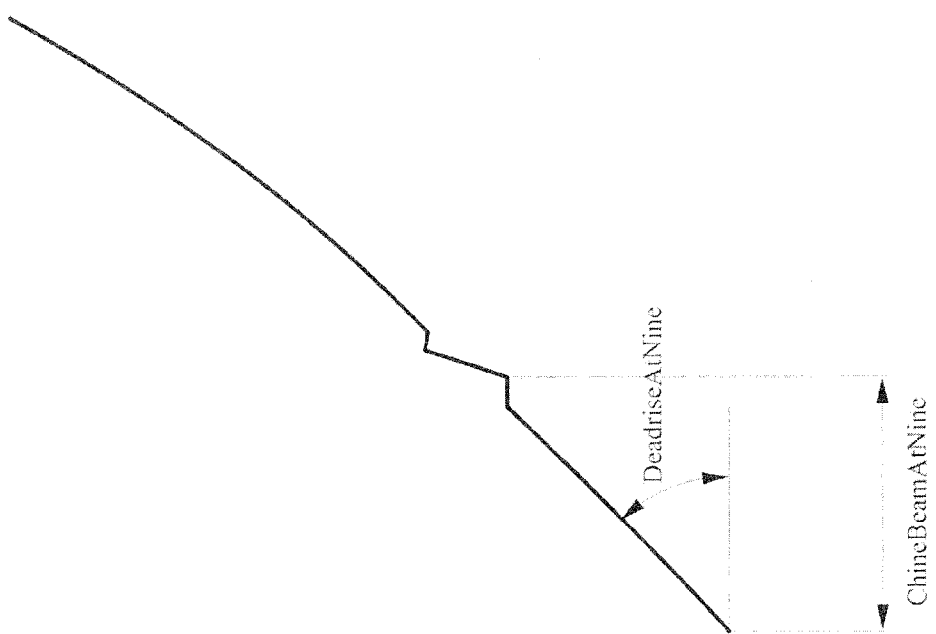
FIG. 8 is an illustration of exemplary section 9 dimensions, which are inputted into a hull modeling method of an embodiment.

As shown in FIG. 5, in one embodiment, these sections include section 0 (at the transom) and section 5 (at midship) (and preferably also section 9). FIG. 6 illustrates the dimensions used at the transom of a hard-chine planing hull (station 0). As shown in FIG. 6, these dimensions are defined by a deadrise angle, chine beam and width, chine angle, hull beam, and hull height. The software application also allows users to create a secondary chine, which is controlled by the height above the chine at the transom, the width, the angle with respect to the Y-axis, and the height above the chine at the bow. FIGS. 7 and 8 illustrate the dimensions at sections 5 and 9.

Figure 9:
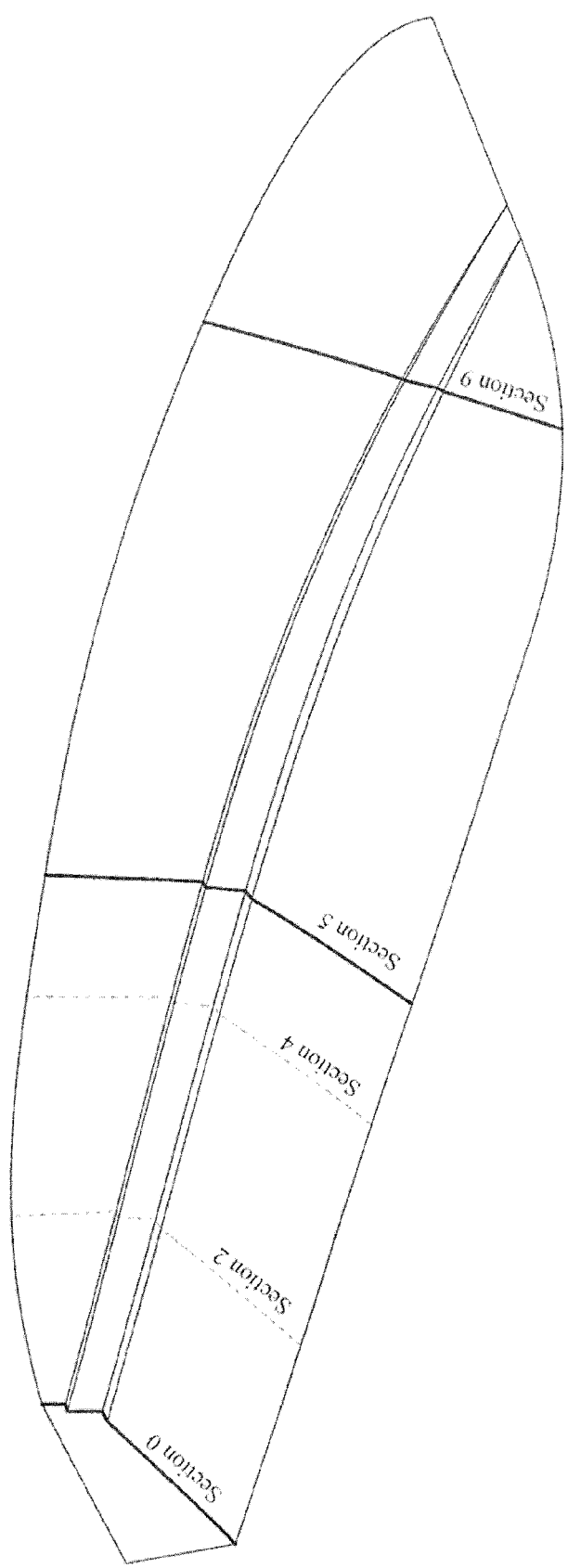
FIG. 9 is an illustration of how sections 2 and 4 are interpolated by a hull modeling method of an embodiment.

With these inputted dimensions, the software application can then interpolate the dimensions of at least one boat hull section between the two non-adjacent boat hull sections. As shown in FIG. 9, in this example, the two other sections are sections 2 and 4. (It should be noted that FIG. 9 and other figures shown half of the boat hull for ease of illustration.) While section 9 is not used in this interpolation, the dimensions of section 9 can be used to better fit a curve, as will be discussed below Any suitable method for interpolating these sections can be used. In one embodiment, the following interpolation equations are used for interpolating sections 2 and 3, although other approaches can be used:

Interpolation Equations for Section Two $$\text{ChineBeamAtTwo} = (\text{ChineBeamAtTransom}) * (C_{02}) + \text{ChineBeamAtMidship} * (C_{52})$$

$$\text{DeadriseAtTwo} = (\text{DeadriseAtTransom}) * (D_{02}) + \text{DeadriseAtMidship} * (D_{52})$$

$$\text{BeamAtTwo} = (\text{BeamAtTransom}) * (B_{02}) + \text{BeamAtMidship} * (B_{52})$$

$$\text{HullHeightAtTwo} = (\text{HullHeightAtTransom}) * (Z_{02}) + \text{HullHeightAtMidship} * (Z_{52})$$

Figure 10:
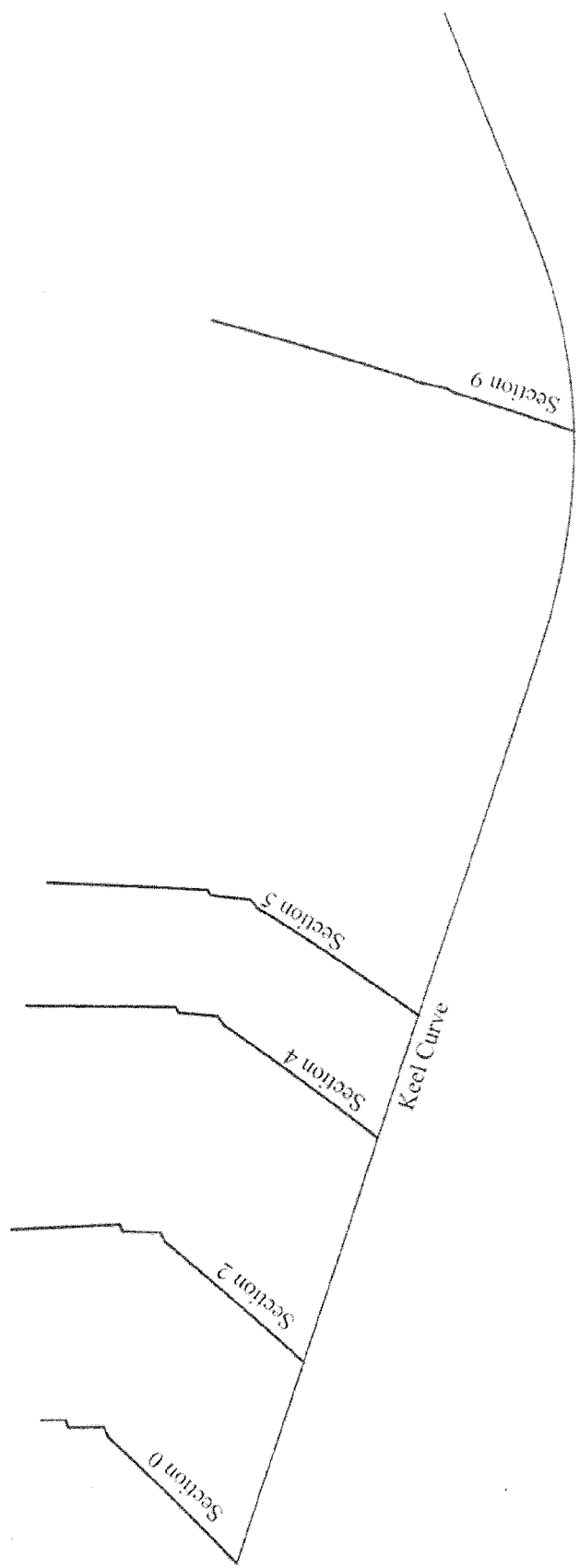
FIG. 10 is an illustration of how sections 2 and 4 are created by a hull modeling method of an embodiment.

Interpolation Equations for Section Four $$\text{ChineBeamAtFour} = (\text{ChineBeamAtTransom}) * (C_{04}) + \text{ChineBeamAtMidship} * (C_{54})$$

$$\text{DeadriseAtFour} = (\text{DeadriseAtTransom}) * (D_{04}) + \text{DeadriseAtMidship} * (D_{54})$$

$$\text{BeamAtFour} = (\text{BeamAtTransom}) * (B_{04}) + \text{BeamAtMidship} * (B_{54})$$

$$\text{HullHeightAtFour} = (\text{HullHeightAtTransom}) * (Z_{04}) + \text{HullHeightAtMidship} * (Z_{54})$$

where "transom" refers to section 0, "midship" refers to section 5, and $C_{02}$, $C_{52}$, $D_{02}$, $D_{52}$, $B_{02}$, $B_{52}$, $Z_{02}$, $Z_{52}$, $C_{04}$, $C_{54}$, $D_{04}$, $D_{54}$, $B_{04}$, $B_{54}$, $Z_{04}$, and $Z_{54}$ are design coefficients. FIG. 10 shows the sections after being interpolated.

Figure 11:
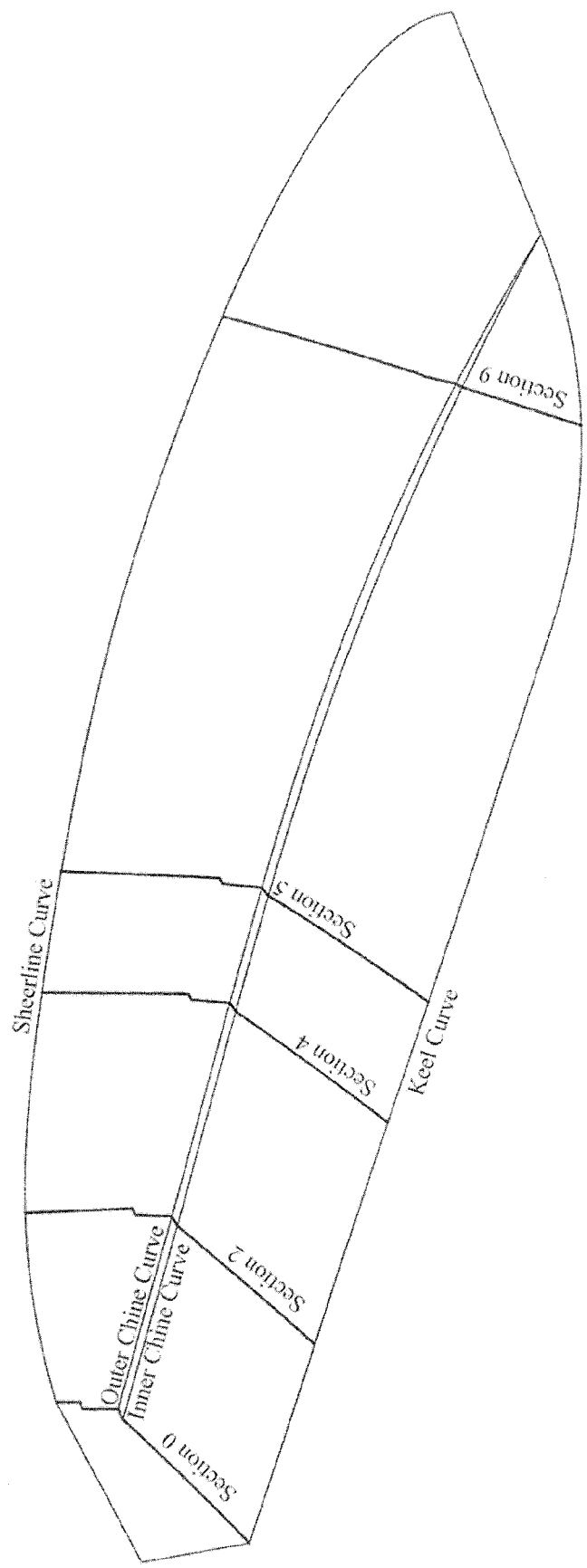
FIG. 11 is an illustration of how a sheerline curve and inner and outer chine curves are created by a hull modeling method of an embodiment.
Figure 12:
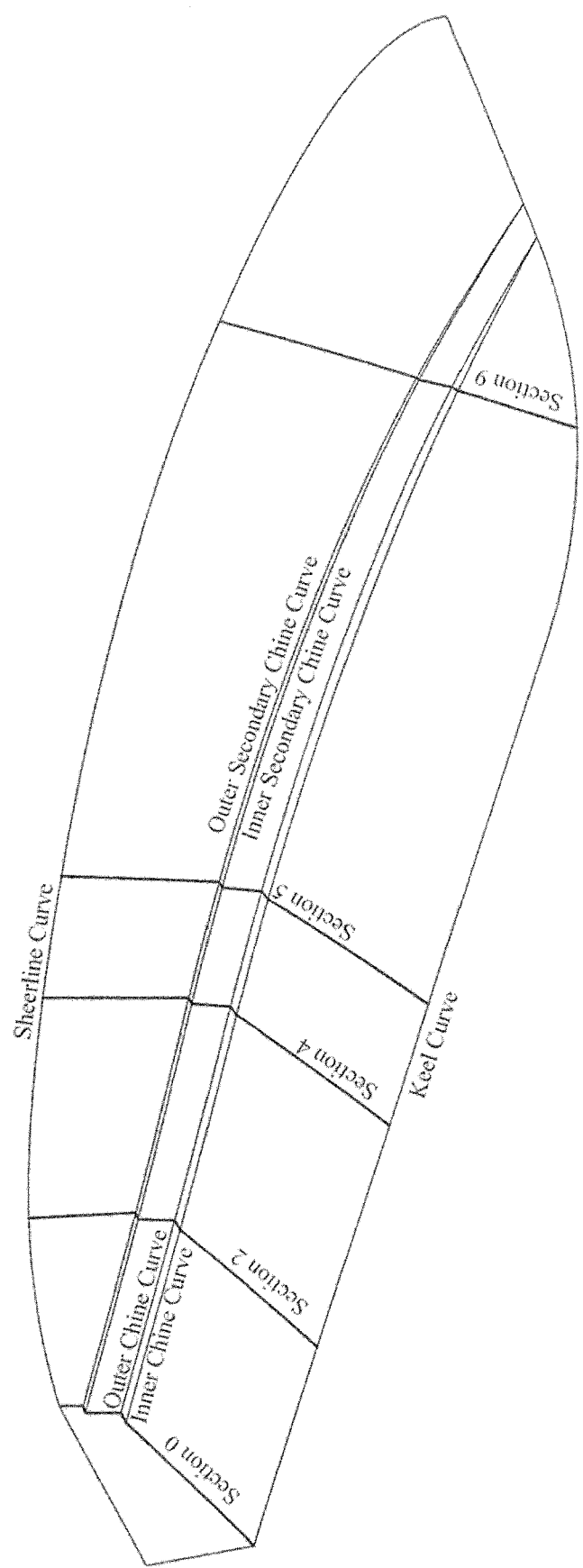
FIG. 12 is an illustration of how outer and inner secondary chine curves are created by a hull modeling method of an embodiment from various sections and inner and outer chine curves.
Figure 13:
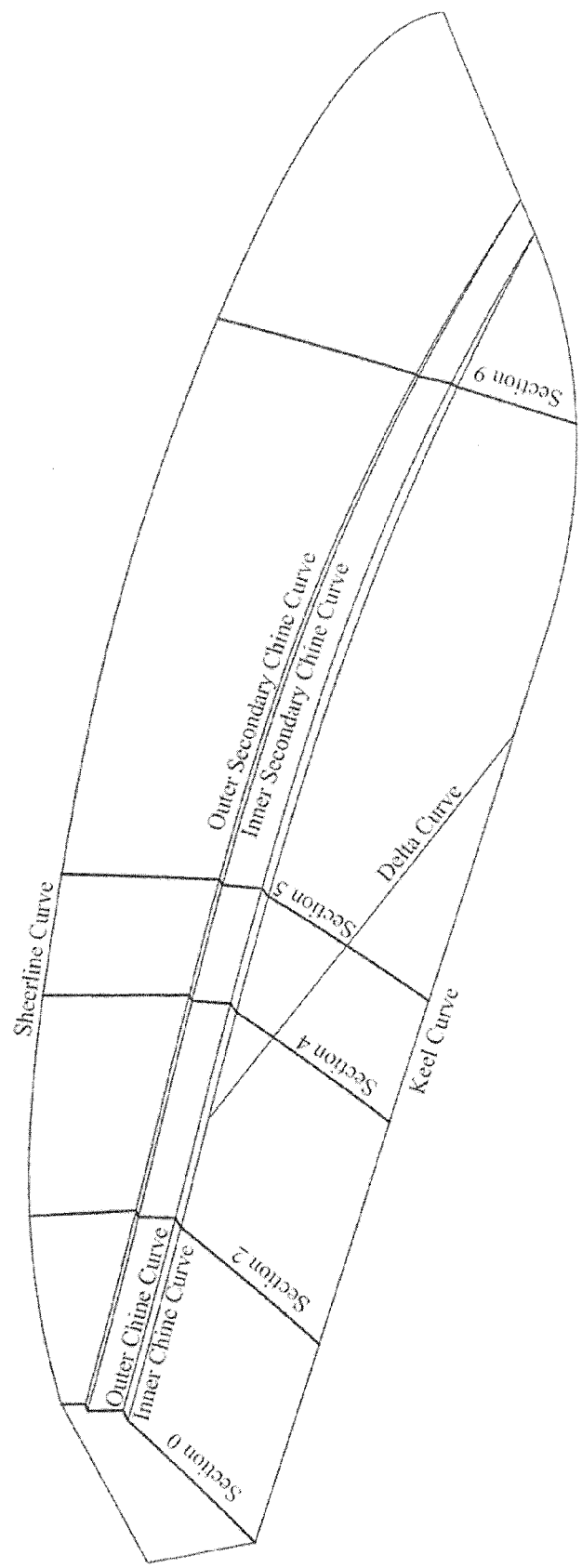
FIG. 13 is an illustration of how a delta curve is created by a hull modeling method of an embodiment from an inner chine curve and a keel curve.

Next, the software application generates curves of the hull based on the dimensions of the plurality of hull sections received from the user (in this example, sections 0, 5, and 9) and the interpolated dimensions of the at least one boat hull section between the two non-adjacent boat hull sections (in this example, sections 2 and 4). The curves are created such that they pass through the necessary points as defined by the section curves. The curves also adjust start and end tangency to match specific combinations of user inputs. For example, the start tangency of the chine curves can automatically adjust to more effectively define straight aft sections if the chine beam and deadrise values at Station 0 and Station 5 are within a specified tolerance of one another. Other geometry can be interpolated based on the user inputs and their relationship to one another. FIGS. 11-13 illustrate some of the curves that can be generated. The sheerline, keel, chine, and delta curves are all cubic NURBS curves.

FIG. 11 shows how a sheerline curve and inner and outer chine curves can be are created from sections 0, 5, and 9 and interpolated sections 2 and 4. Users can create a hull's sheerline in two different ways. For a gently curved sheerline with no discontinuities or sudden changes in curvature, the user can control the sheerline by using the dimensional inputs. If the user desires a sheerline with a more complex shape, the user can input a curve and the maximum beam of the sheerline, and software application will create a hull with this sheerline shape. The SheerlineCurve input contains the desired source curve, while the MaxBeam, HullHeightAtTransom, and HullHeightAtBow inputs serve as the bounds for the new sheerline domain. The input curve is domain mapped from its original domain to the new sheerline domain.

FIG. 12 shows how outer and inner secondary chine curves can be created from sections 0, 5, and 9 and interpolated sections 2 and 4, as well as from inner and outer chine curves. For this secondary chine, users have control over the height above the chine at the transom, the width, the angle with respect to the Y-axis, and the height above the chine at the bow. The shape of the secondary chine is controlled by the primary chine. Values from the primary chine are mapped from their source domain into the domain of the secondary chine to control the secondary chine's shape over the length of the hull. The secondary chine inputs can be used to create a wide variety of hullforms. The secondary chine can be used as a style line and/or additional spray rail, or it can be used to create more complex, double-chine hullforms.

FIG. 13 illustrates how a delta curve can be created from an inner chine curve and a keel curve. As used herein, a "delta curve" refers to a diagonal curve that the software application uses to develop a running surface with the desired curvature that is continuous and fair. The delta curve runs diagonally from the inner chine at Station 3 to the keel at Station 7. The curve is meant to approximate the planing hull's running condition, with Station 3 corresponding to a mean wetted chine and Station 7 corresponding to a mean wetted keel. As with the transom convexity curve, the Delta Curve uses a point located at 33% of the length of the line between the inner chine at Station 3 and the keel at Station 7 to control curvature. The Delta Curve is created as an interpolate curve running from the inner chine at Station 3 through the convexity point and ending at the keel at Station 7. The running surface of the hull is created by sweeping the transom convexity curve and the delta curve across the keel curve and inner chine curve. This method yields a running surface with a planar aft region and a curved forward region divided by the Delta Curve.

Figure 14B:
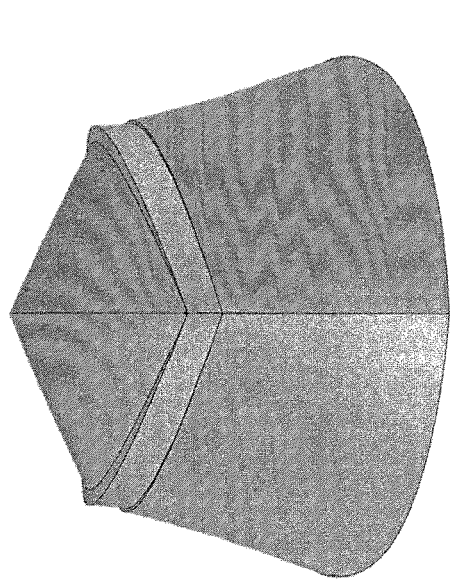
FIGS. 14A, 14B, 15A, and 15B illustrate the impact of the use of the delta curve on surface curvature of an embodiment.
Figure 15B:
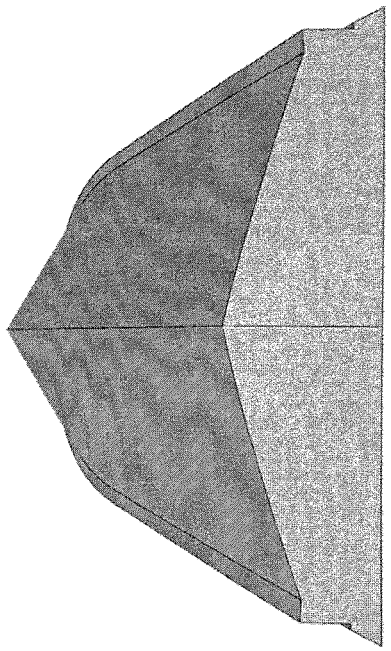
Figure 14A:
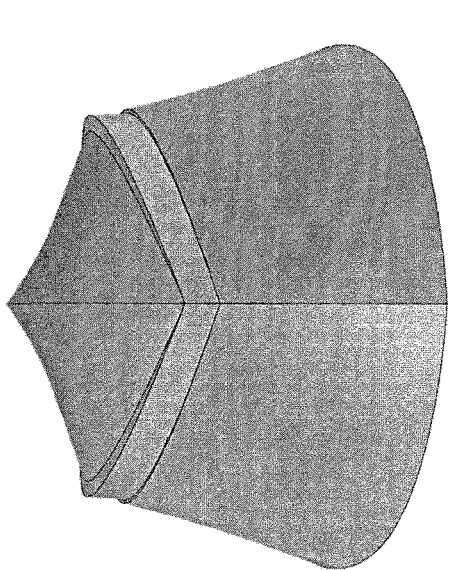
Figure 15A:
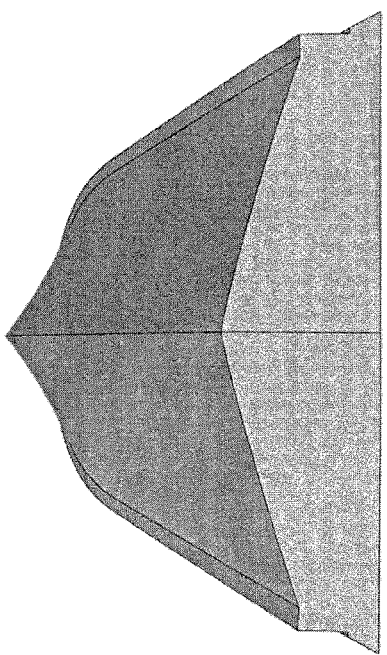

FIGS. 14A, 14B, 15A, and 15B illustrate the impact of the use of the delta curve on surface curvature of an embodiment. FIGS. 14A and 15A show a hull model created without a delta curve, and FIGS. 14B and 15B show a hull model created with a delta curve. As can be seen in these illustrations, the use of a delta curve prevent the "sag" in the curvature in the bottom of the hull.

Figure 16:
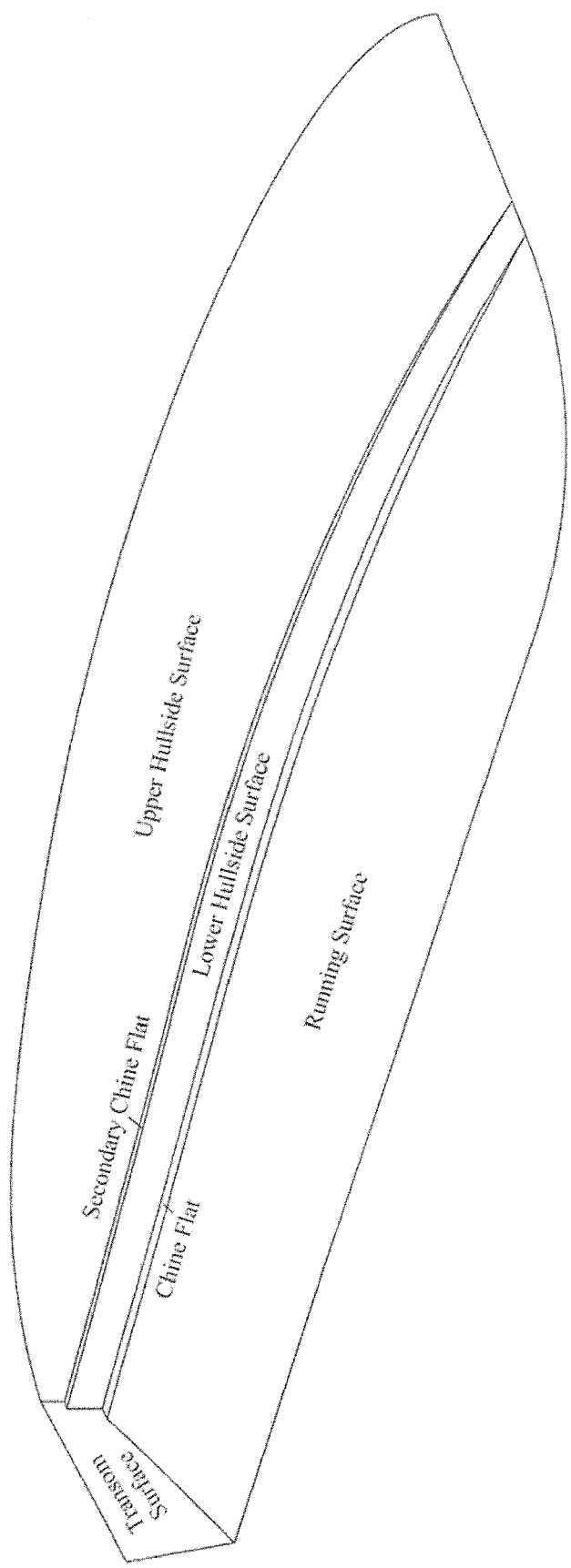
FIG. 16 is an illustration of how hull surfaces are created from a curve structure by a hull modeling method of an embodiment.

Next, the software application uses the generated curves to create surfaces of the boat hull. As shown in FIG. 16, these surfaces can include, but are not limited to, the transom surface, the upper hullside surface, the lower hullside surface, the running surface, the chine flat, and the secondary chine flat. Because this embodiment relies on an underlying curve structure, it does not require the user to edit NURBS control points or control polygons to change the surface, as required by other approaches.

Figure 17:
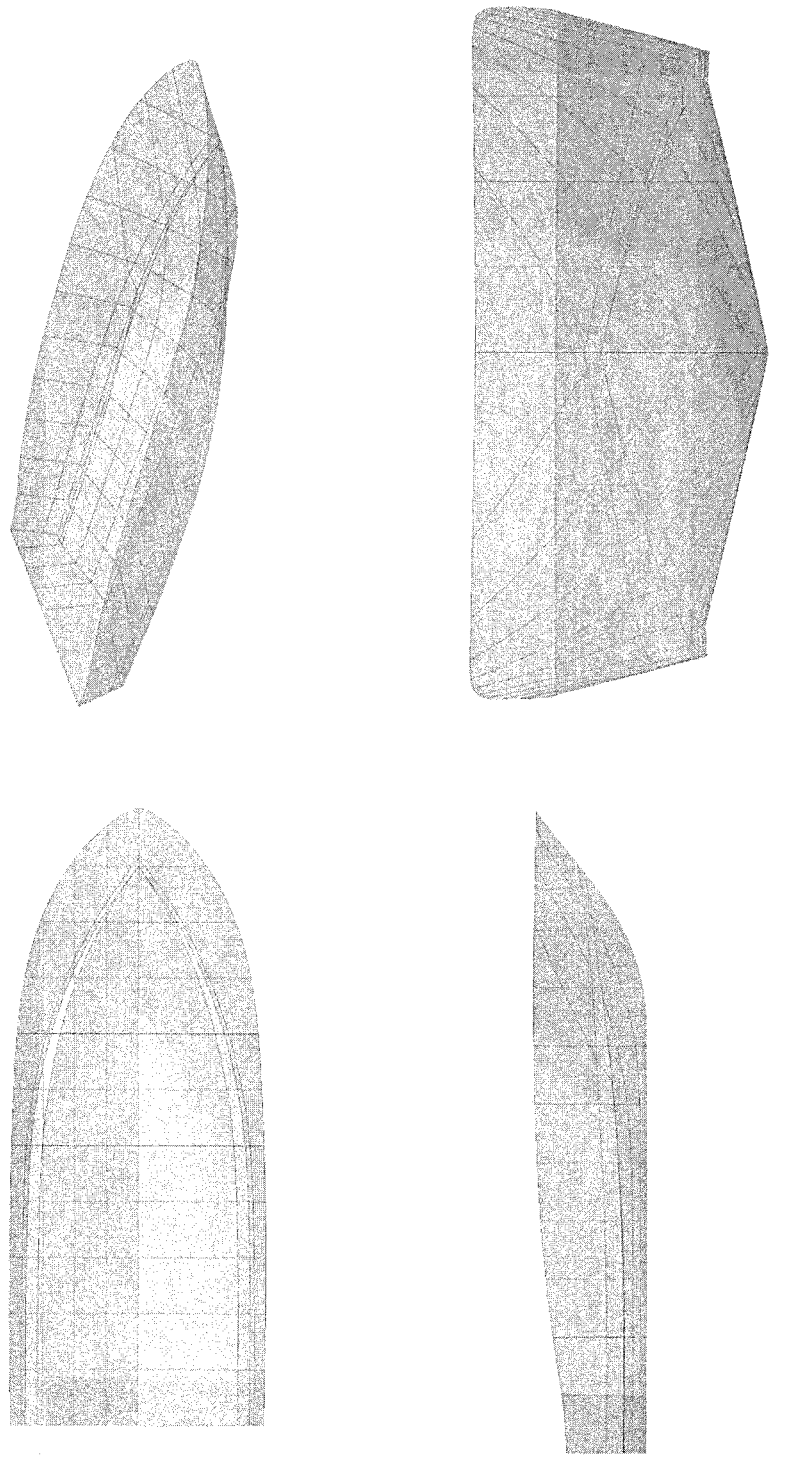
FIG. 17 is an illustration of an output display of an embodiment.
Figure 18:
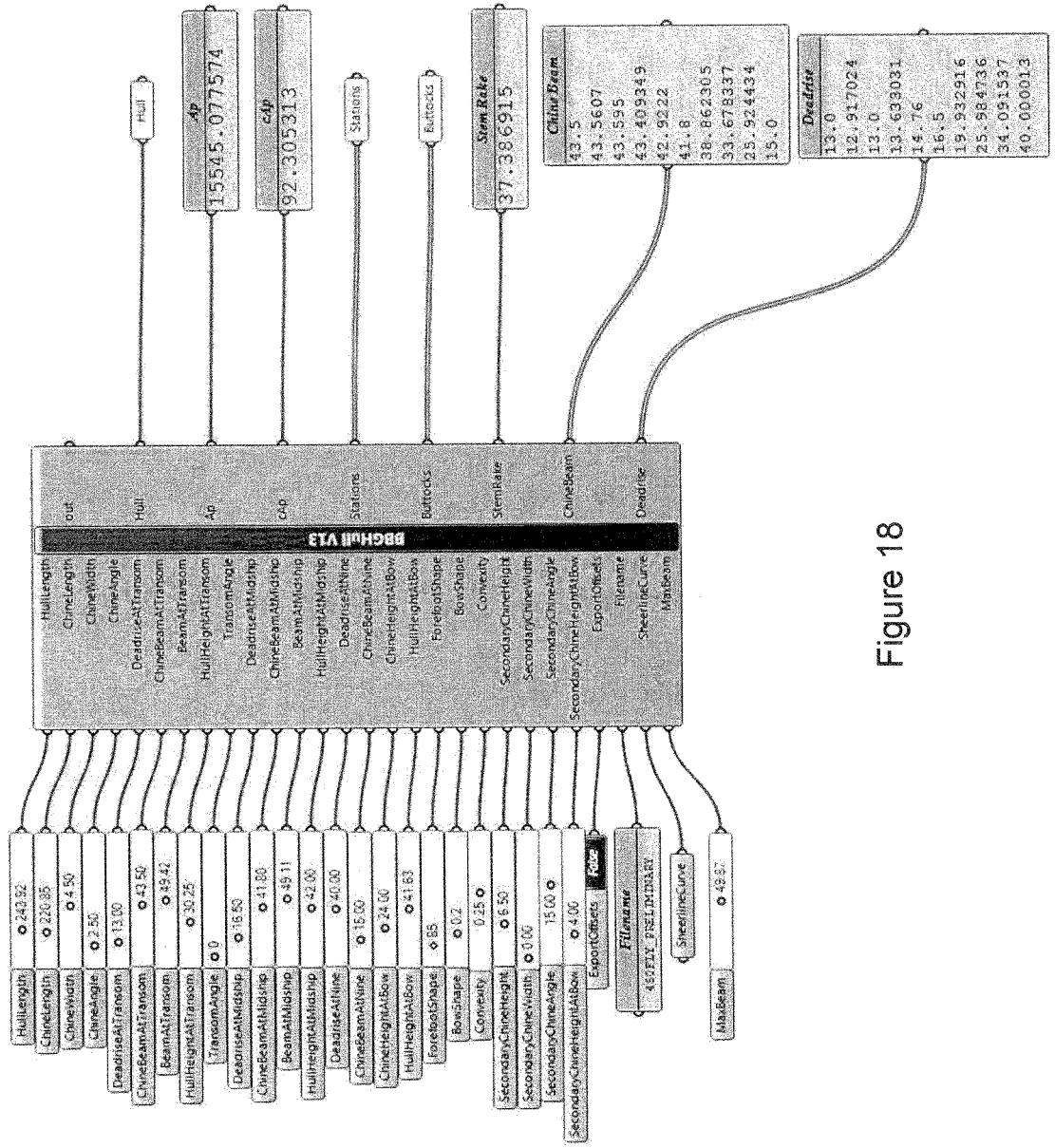
FIG. 18 is an illustration of an input display of an embodiment.
Figure 19:
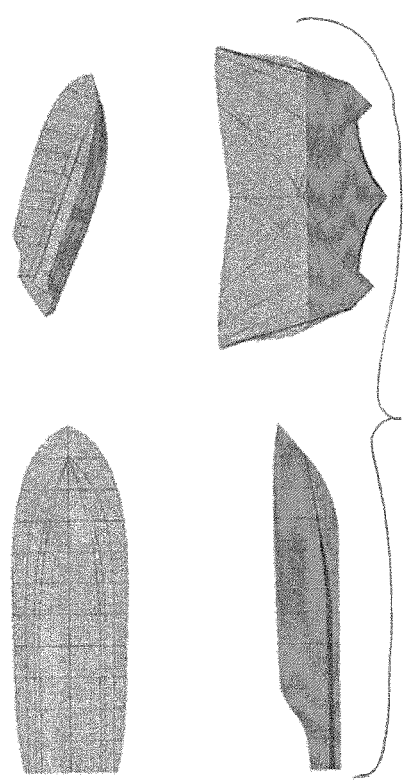
FIGS. 19, 20, 21, and 22 are illustrations of hull models created by a hull modeling method of an embodiment.
Figure 20:
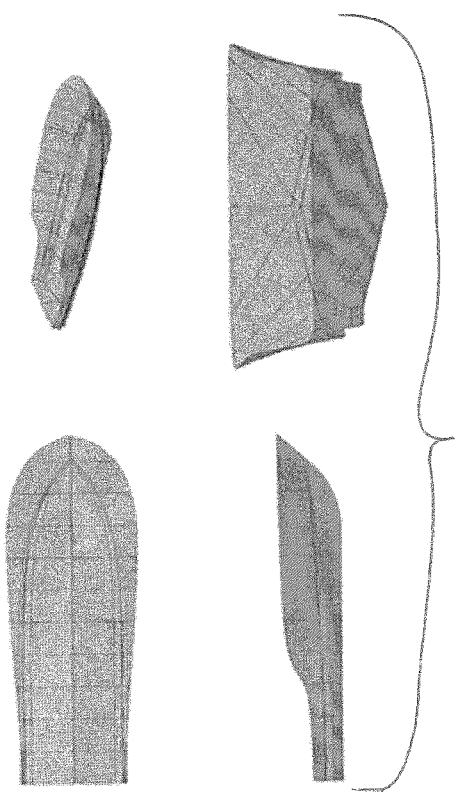
Figure 21:
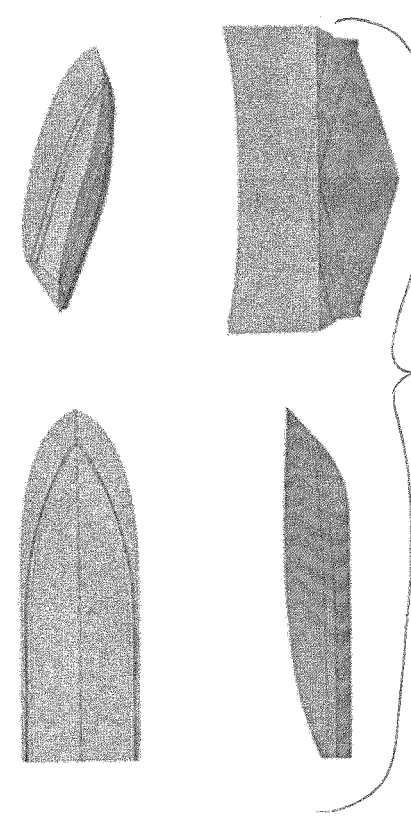
Figure 22:
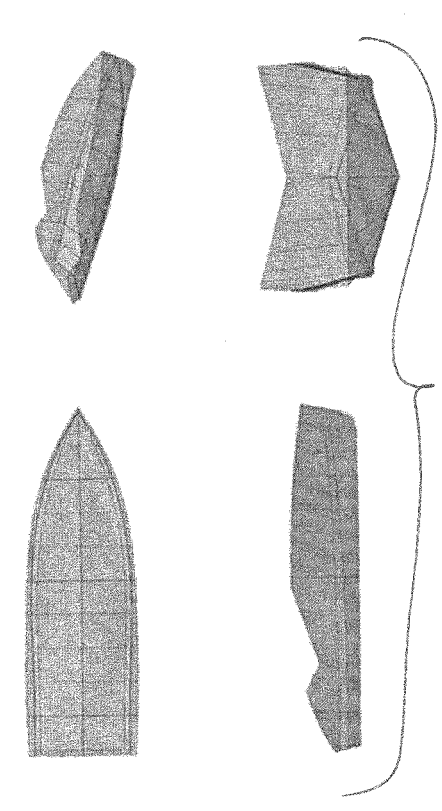

Finally, the software application generates and displays a planing hull model from the created surfaces. FIG. 17 shown various view of the planing hull model generated in one example. It should be noted that the software application allows the user to "tweak" one or more of the inputs (e.g., via the input screen shown in FIG. 18) and then dynamically adjusts the displayed planing hull model based on the changes. This allows for parametric software iterations with on-the-fly simulations. FIGS. 19-22 show various hull models that are generated in this fashion.

Figure 23C:
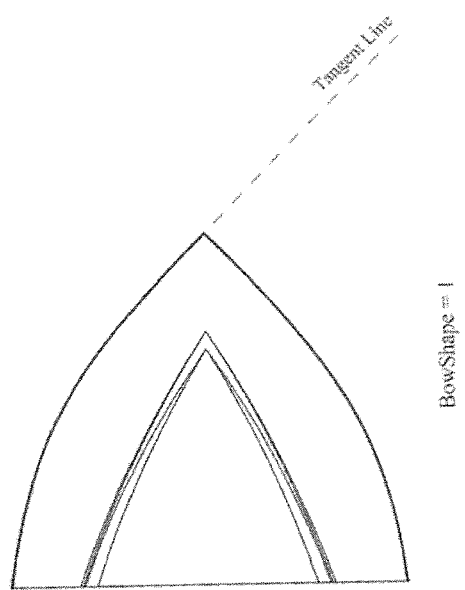
FIGS. 23A, 23B, and 23C are illustrations of the effect of a bow shape parameter of an embodiment.
Figure 23B:
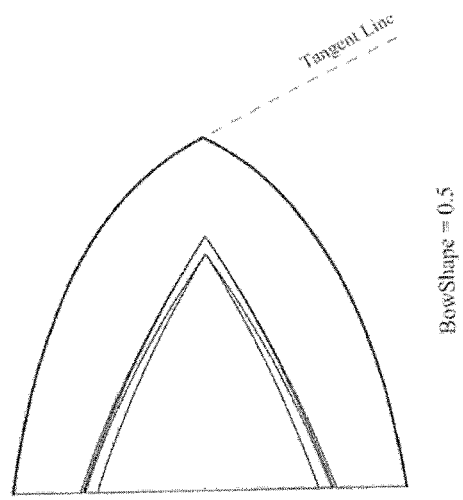
Figure 23A:
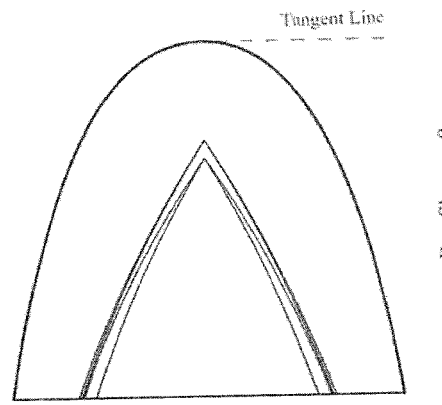
Figure 24:
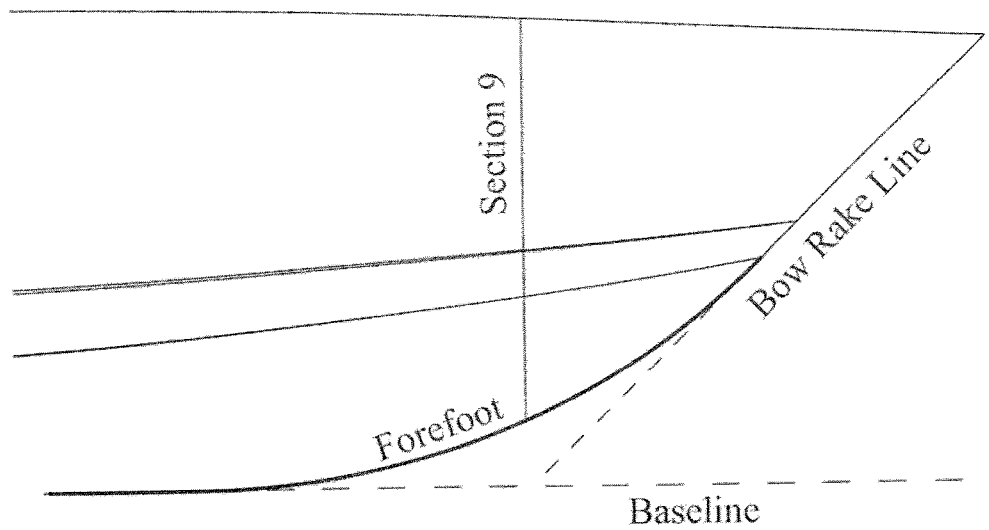
FIG. 24 is an illustration of the effect of a forefoot shape parameter of an embodiment.

It should be noted that while only user input on sections 0, 5, and 9 were used in the above illustration, additional user inputs can be used to refine the hull model. For example, as shown in FIGS. 23A, 23B, and 23C, different bow shape parameters can affect the shape of the bow. Also, as shown in FIG. 24, a forefoot shape parameter can affect the curvature of the bow rake line with respect to the baseline. That is, the software application allows the user to have explicit control over Station 9, which has a profound impact on the forward sections of the hull. The user can control the chine beam and deadrise at Station 9, both of which significantly influence the shape of the chine curves.

The user also has explicit control of the shape of the forefoot of the keel curve. The Forefoot Shape input defines the radius of the fillet arc between the Baseline and the Bow Rake Line. A Forefoot Shape value of 0 equates to a sharp discontinuity at the bow/keel intersection.

Figure 25:
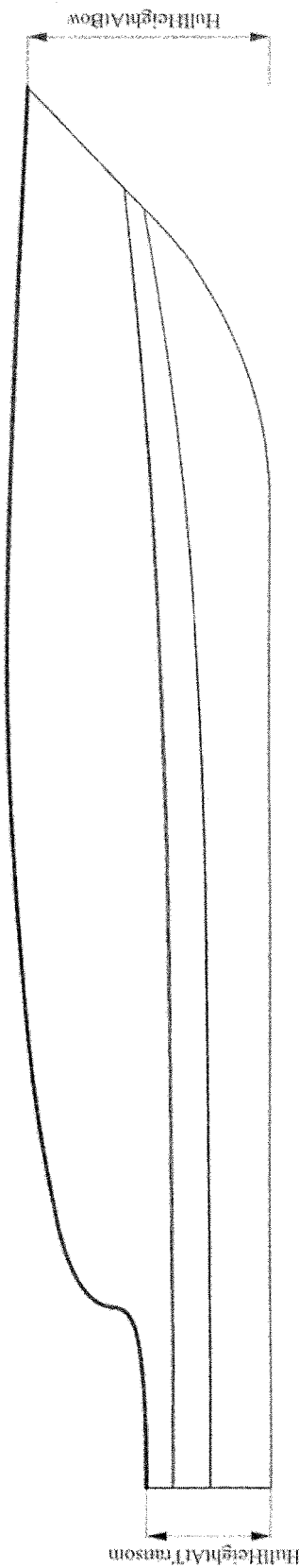
FIG. 25 is a profile view of a sheerline curve created from an input curve using a hull modeling method of an embodiment.
Figure 26:
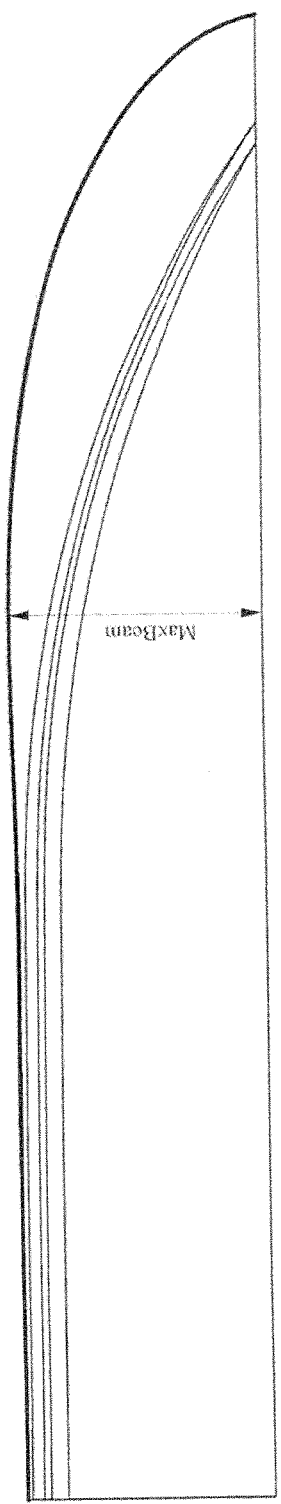
FIG. 26 is a plan view of a sheerline curve created from an input curve using a hull modeling method of an embodiment.
Figures 27, 28:
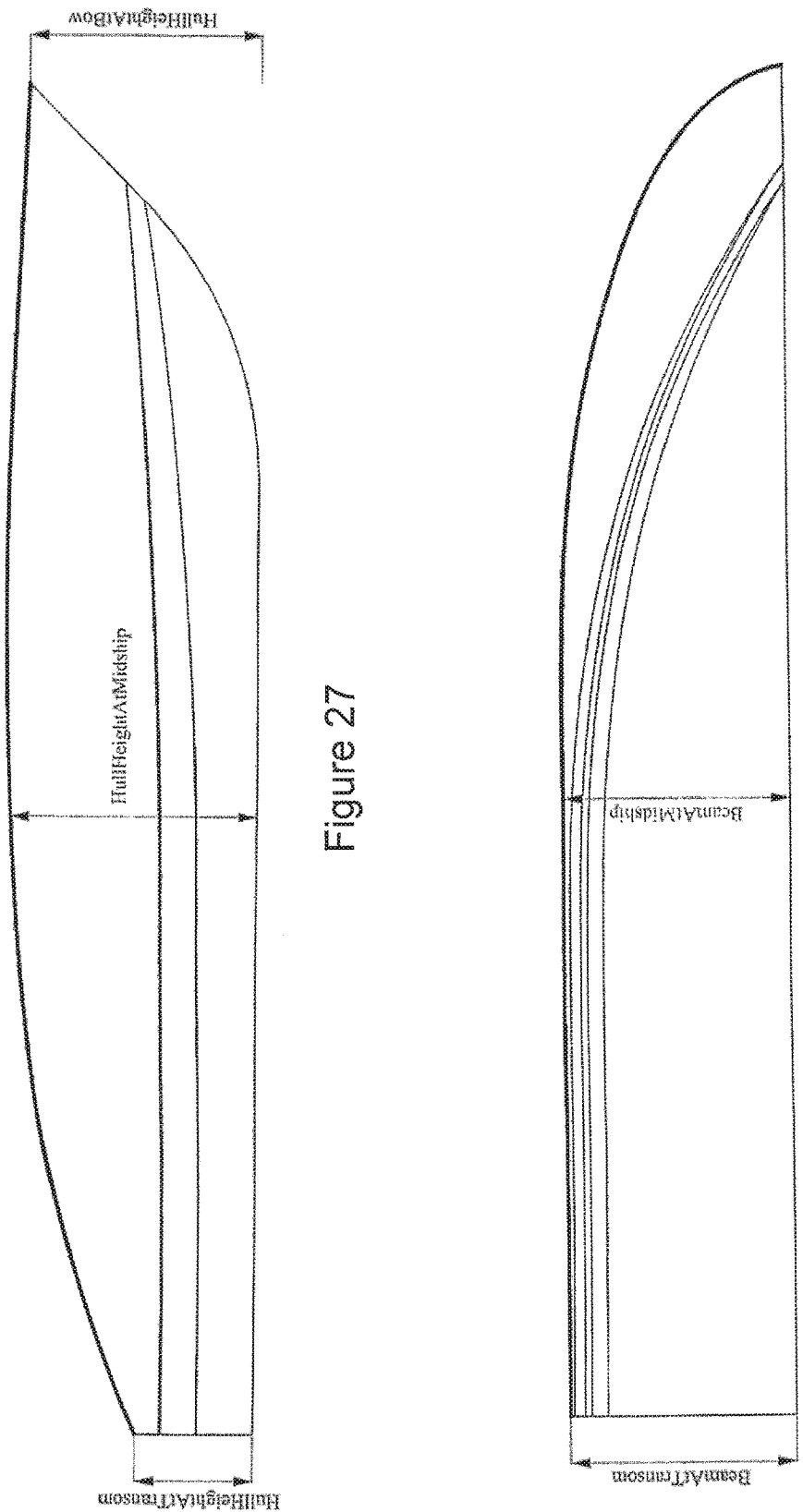
FIG. 27 is a profile view of a sheerline curve created from dimensional inputs using a hull modeling method of an embodiment.
FIG. 28 is a plan view of a sheerline curve created from dimensional inputs using a hull modeling method of an embodiment.
Figure 29:
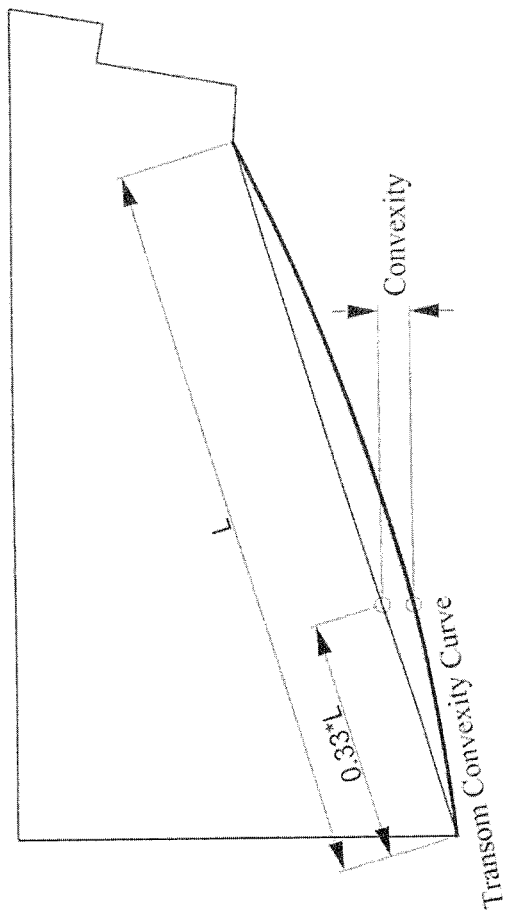
FIG. 29 is an illustration of the effect of a convexity parameter of an embodiment.

Further, FIGS. 25 and 26 show the hull height at the transom and the hull height at the bow affect the sheerline curve, and FIGS. 27 and 28 show the beam at the transom, the hull height at the transom, the beam at the midship, the hull height at the midship, and the hull height at the bow affect the sheerline curve. Further, FIG. 29 shows the effect of the convexity parameter on the transom curve. Curvature in a hull's running surface is defined by the Convexity input. This input corresponds to the vertical movement of a point on the transom deadrise line between the keel and the inner chine. This point exists at 33% of the length of the line, beginning at the keel. A positive Convexity value will result in a downward movement of the point, creating positive curvature, while a negative value will result in an upward movement of the point, creating negative curvature. A Convexity value of 0 will result in straight sections. The Transom Convexity Curve is created as an interpolate curve running from the keel through the convexity point and ending at the inner chine.

Figure 30:
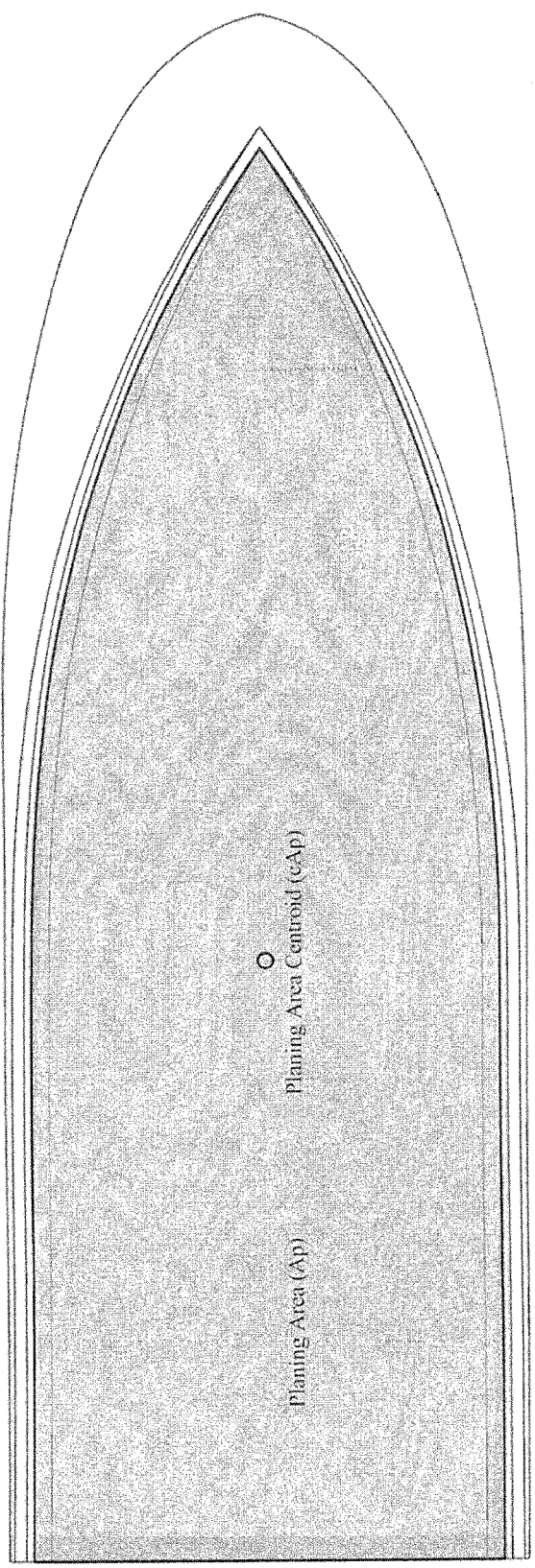
FIG. 30 is an illustration of Ap and cAp outputs of an embodiment.
Figure 31:
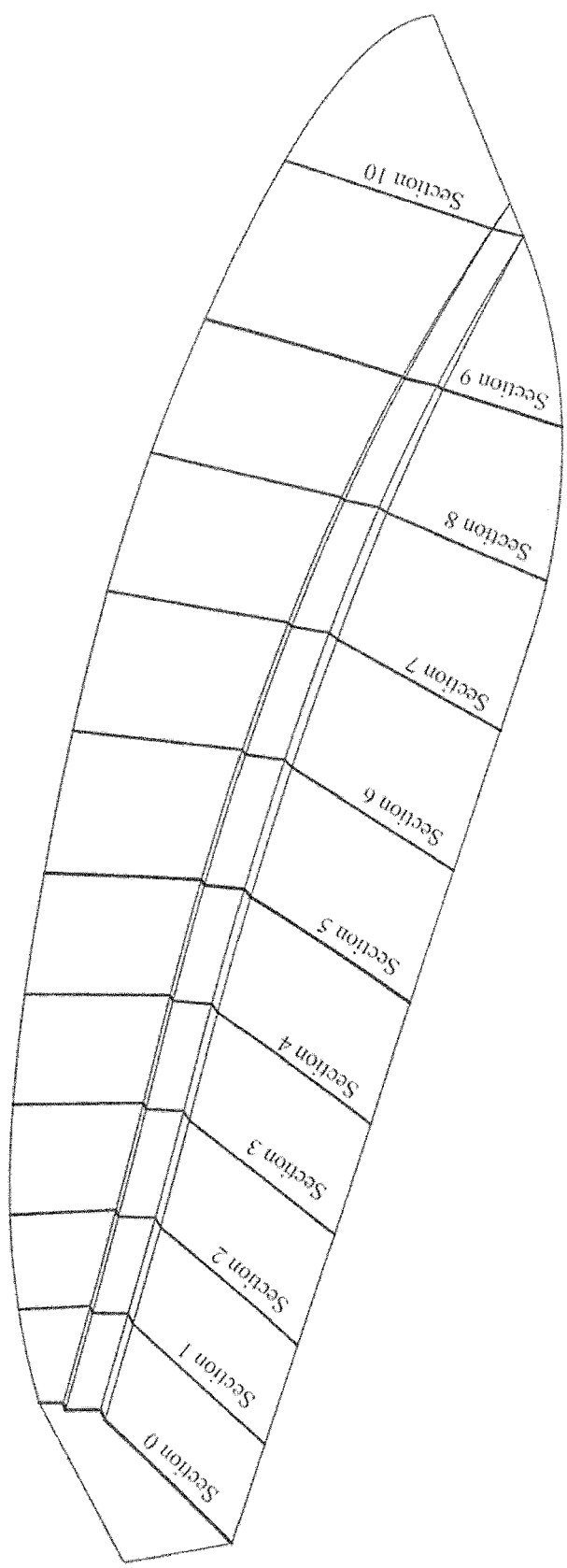
FIG. 31 is an illustration of sectional output of an embodiment.
Figure 32:
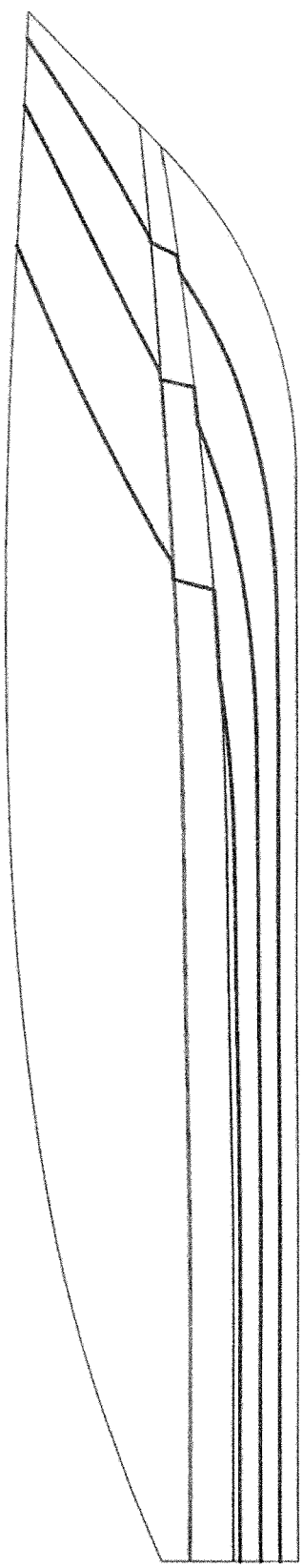
FIG. 32 is an illustration of a buttocks output of an embodiment.
Figure 33:
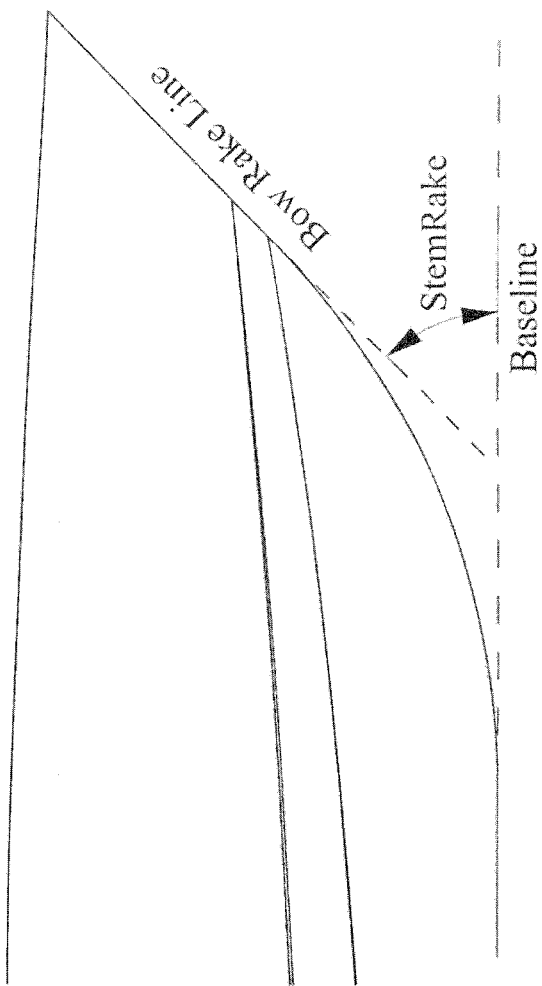
FIG. 33 is an illustration of a stem rake output of an embodiment.

As noted above, the hull model is just one of the possible outputs of the software application of this embodiment. Other possible outputs include a display of the planing area (Ap) and the planing area centroid (cAp) (FIG. 30), a display of all the sections (stations) of the hull (FIG. 31), a display of the buttocks (FIG. 32), a display of the stem rake (FIG. 33), and an offsets file output (e.g., a .CSV file) (FIG. 34).

Figure 35:
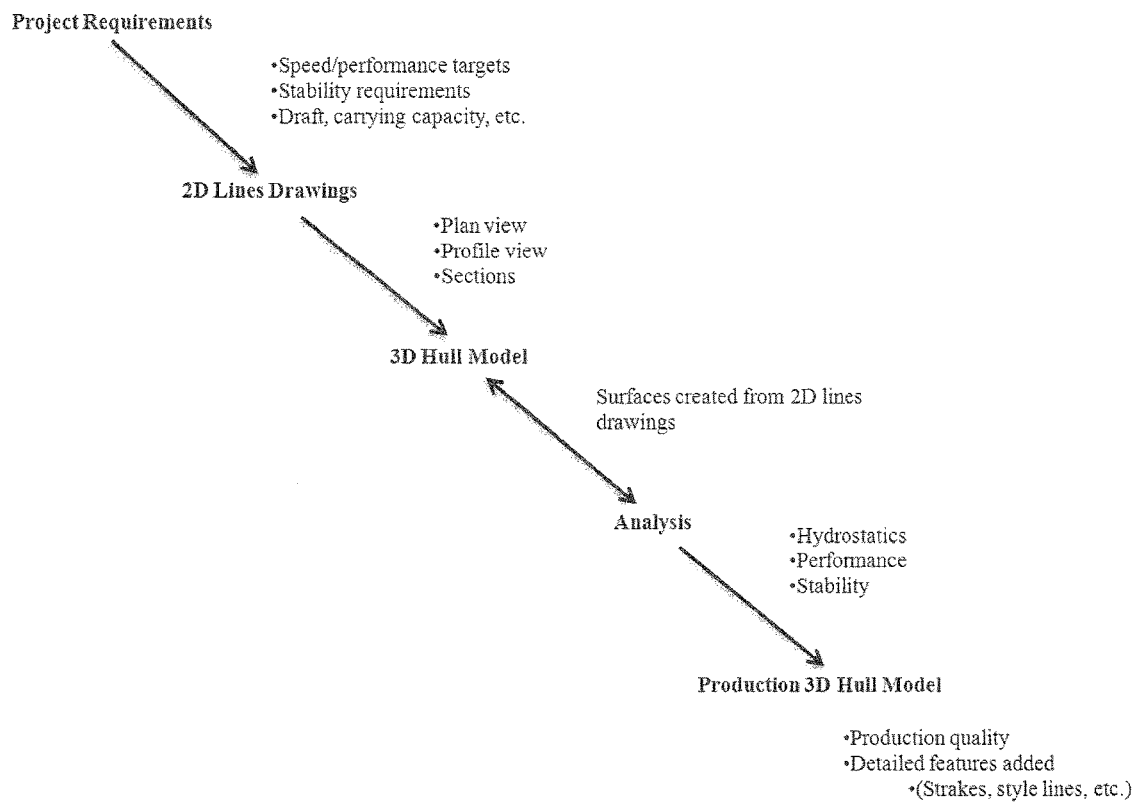
FIG. 35 is an illustration of a typical hull design process.

There are many advantages associated with these embodiments. For example, the methods discussed above provide a solution for the naval architect to develop hulls in an easy and expedited manner. At the outset of a design project, the naval architect is tasked with creating a hull that will meet the project requirements. These requirements can include everything from straight-line performance to stability and seakeeping, and often include unique constraints such as draft or passenger carrying capacity. The hull may also be constrained in length and/or beam based on the project requirements. A hull is typically developed from a series of 2D drawings made by the naval architect. These drawings usually include some sections, a plan view, and a profile view. A 3D model of the hull is then created from these 2D drawings. Creating this 3D model requires a skilled freeform modeler and is often time consuming. Depending on the quality of the original lines, the process of creating surfaces from lines can take anywhere from several hours to a few days. Parameters are modified until the surfaces are fair and meet the naval architect's satisfaction. Throughout this iterative process, the naval architect must evaluate the vessel's static trim, resistance, and stability to ensure that the finished boat will meet the project requirements. Additional features such as strakes and hull penetrations (windows, thru hulls, etc.) are typically added to the hull model later in the design process, once the principal parameters are firmly set and the layout and key components are more thoroughly defined. Additional hull bottom features that effect running characteristics, such as hook or rocker, are typically added to the model after the hull has undergone performance testing. FIG. 35 shows a diagram of a typical hull design process.

Figure 36:
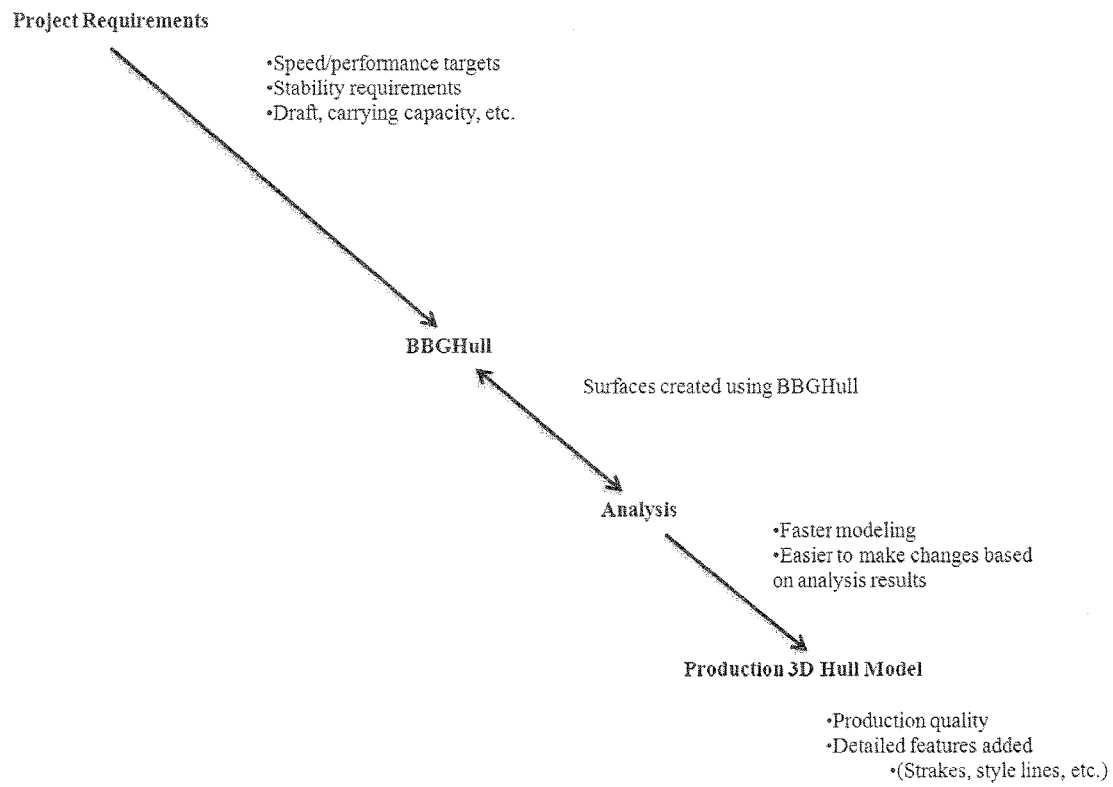
FIG. 36 is an illustration of a hull design process of an embodiment.

The computerized method of these embodiments can assist the naval architect in developing parametric planing hull models in an easy and expedited manner by facilitating a more-thorough exploration of the design space early in a given project. These embodiments effectively eliminate the need to create 2D lines drawings and allow the designer to immediately begin creating hull surfaces by inputting the hull's key dimensional parameters. The designer can then begin analyzing hull models and easily change a hull's key parameters based on the analysis results. FIG. 36 shows a diagram of the hull design process using these embodiments.

These embodiments rely upon an underlying curve structure from which all hull surfaces are developed. The user inputs correspond to a series of Non-Uniform Rational B-Splines (NURBS) interpolation curves that form the underlying curve structure from which the finished hull surface is created. The use of Grasshopper allows multiple instances of the software application to be created simultaneously. The user can specify a secondary chine, including the starting height, ending height, width, and angle. The user can explicitly define the forward sections of the hull, including deadrise, chine beam, and surface curvature (convex, straight, or concave). These methods allow multiple hard-chine hull typologies to be created quickly and easily.

These methods can be used to streamline and accelerate the hull design process early on in a project. They allow for fundamental changes to be made to a hull's geometry instantaneously at any time during the hull's initial development. These methods provide a powerful design tool that can be used to develop planing hulls of nearly any size and any shape. In addition to creating a hull surface, these methods can be used to provide the user with several useful outputs, including the hull's planing area and centroid, section curves, buttock curves, and pertinent offsets.

Many alternatives can be used with these embodiments. For example, the software application creates curves and surfaces using a method that does not require users to modify control points in any way. Complex NURBS surfaces like boat hulls often require users to manipulate control points to achieve the desired result. In one embodiment, the software application uses a curve-based structure and interpolate curves rather than NURBS control-point curves to create hull surfaces. The user inputs all correspond to an easily traceable result. A user is able to understand the effects of each parameter, and can even reverse engineer hulls that have already been created by evaluating the hull at its key points. Moving a single point on the deadrise line of a control point curve and an interpolate curve can produce significantly different results. The interpolate curve passes through the translated point, while a control point curve will only pass through the translated point if the appropriate weight is specified. This additional input adds complexity and necessitates that the user be proficient in the mathematical definition of NURBS curves.

Exemplary Computer Implementation

As mentioned above, in one presently preferred embodiment, the above methods for creating a parametric planing hull model is implemented as a computer program (sometimes referred to herein as "BBGHull") that runs within Grasshopper, which is a currently-available, free plug-in for a 3D modeling software program called Rhinoceros. The software application of this embodiment can create a parametric planing three-dimensional hull model for a planing hull with multiple hard chines. The dimensions of the model can be explicitly prescribed at three or more different sections along the length of the hull. The model is composed of multiple, individual surfaces that form the complete hull when joined together. The model utilizes a diagonal curve, known as the delta curve, to develop a running surface with the desired curvature that is continuous and fair. The delta curve runs diagonally from the keel to the chine at an obtuse angle relative to the X-axis. The user can prescribe the surface curvature of the running surface. The user can prescribe the curvature of the sheerline using explicit dimensional inputs or using a source curve.

In this embodiment, hull development is based on eleven section curves, or sections. These curves are spaced evenly over the chine length of a hull, beginning with Section 0 at the transom/keel intersection and ending with Section 10 at the chine/stem intersection. Half sections are used for clarity. The curve structure created in this software application is formed from these section curves. The curve structure consists of a section curve at the transom (Section 0), a section curve at midship (Section 5), a section curve at Section 9, a sheerline curve, inner and outer chine curves, and a keel curve.

The sheerline, keel, and chine curves are all cubic NURBS curves. These curves are created such that they pass through the necessary points as defined by the section curves. The curves also adjust start and end tangency to match specific combinations of user inputs. For example, the start tangency of the chine curves will automatically adjust to more effectively define straight aft sections if the chine beam and deadrise values at Section 0 and Section 5 are within a specified tolerance of one another. All other geometry is interpolated based on the user inputs and their relationship to one another. Surfaces are then developed using the curve structure. Because the software application relies on an underlying curve structure, it does not require the user to edit NURBS control points or control polygons to change the surface. The models generated by the software application can be created with convex, straight, or concave sections. On typical finished hulls, maximum surface curvature occurs around section 7. The Convexity input in software application corresponds to the vertical movement of interpolate points at select sections along the running surface of the hull. A positive convexity value would provide positive curvature, or convexity on the running surface, while a negative value would produce negative curvature, or concavity. A value of 0 would produce straight sections. The chosen surface curvature is blended throughout the rest of the sections, using interpolate values to define the distribution. The distribution is designed to scale with the input hull dimensions to produce a satisfactory running surface. The user interacts with interpolate points rather than NURBS control points. This allows the user to easily understand exactly how each curve is developed and controlled.

Figure 37:
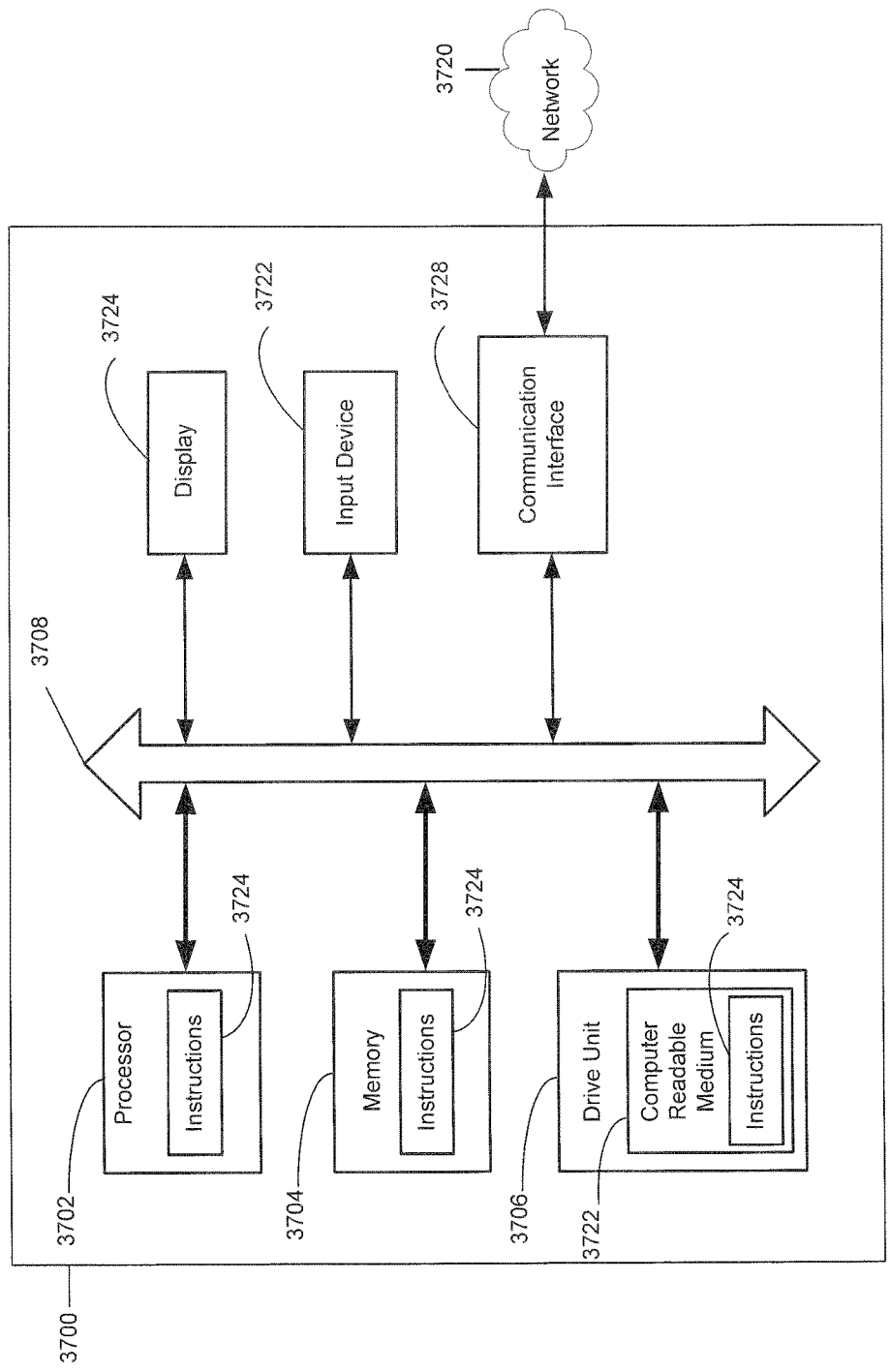
FIG. 37 is a block diagram of an exemplary implementation of an embodiment.

Of course, this is just one particular implementation, and other implementations can be used. More generally, the above methods can be performed by a processor executing computer-readable and executable program code. FIG. 37 is a block diagram of one exemplary implementation.

FIG. 37 illustrates a general computer system 3700. Not all of the depicted components may be required, however, and some implementations may include additional components not shown in the figure. Variations in the arrangement and type of the components may be made without departing from the spirit or scope of the claims as set forth herein. Additional, different or fewer components may be provided.

The computer system 3700 may include a set of instructions 3724 that may be executed to cause the computer system 3700 to perform any one or more of the methods or computer based functions disclosed herein. The computer system 3700 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 3700 may also be implemented as or incorporated into various devices, such as a personal computer (PC), server, or any other machine capable of executing a set of instructions 3724 (sequential or otherwise) that specify actions to be taken by that machine. In a particular embodiment, the computer system 3700 may be implemented using electronic devices that provide voice, video or data communication. Further, while a single computer system 3700 may be illustrated, the term "system" shall also be taken to include any collection of systems or sub-systems that individually or jointly execute a set, or multiple sets, of instructions to perform one or more computer functions.

As illustrated in FIG. 37, the computer system 3700 may include a processor 3702, such as, a central processing unit (CPU), a graphics processing unit (GPU), or both. The processor 3702 may be a component in a variety of systems. For example, the processor 3702 may be part of a standard personal computer or a worksection. The processor 3702 may be one or more general processors, digital signal processors, application specific integrated circuits, field programmable gate arrays, servers, networks, digital circuits, analog circuits, combinations thereof, or other now known or later developed devices for analyzing and processing data. The processor 3702 may implement a software program, such as code generated manually (i.e., programmed). The computer system 3700 may include a memory 3704 that can communicate via a bus 3708. The memory 3704 may be a main memory, a static memory, or a dynamic memory. The memory 3704 may include, but may not be limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one case, the memory 3704 may include a cache or random access memory for the processor 3702. Alternatively or in addition, the memory 3704 may be separate from the processor 3702, such as a cache memory of a processor, the system memory, or other memory. The memory 3704 may be an external storage device or database for storing data. Examples may include a hard drive, compact disc ("CD"), digital video disc ("DVD"), memory card, memory stick, floppy disc, universal serial bus ("USB") memory device, or any other device operative to store data. The memory 3704 may be operable to store instructions 3724 executable by the processor 3702. The functions, acts or tasks illustrated in the figures or described herein may be performed by the programmed processor 3702 executing the instructions 3724 stored in the memory 3704. The functions, acts or tasks may be independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

The computer system 3700 may further include a display 3714, such as a liquid crystal display (LCD), an organic light emitting diode (OLED), a flat panel display, a solid state display, a cathode ray tube (CRT), a projector, a printer or other now known or later developed display device for outputting determined information. The display 3714 may act as an interface for the user to see the functioning of the processor 3702, or specifically as an interface with the software stored in the memory 3704 or in the drive unit 3706.

Additionally, the computer system 3700 may include an input device 3712 configured to allow a user to interact with any of the components of system 3700. The input device 3712 may be a number pad, a keyboard, or a cursor control device, such as a mouse, or a joystick, touch screen display, remote control or any other device operative to interact with the system 3700.

The computer system 3700 may also include a disk or optical drive unit 3706. The disk drive unit 3706 may include a computer-readable medium 3722 in which one or more sets of instructions 3724, e.g. software, can be embedded. Further, the instructions 3724 may perform one or more of the methods or logic as described herein. The instructions 3724 may reside completely, or at least partially, within the memory 3704 and/or within the processor 3702 during execution by the computer system 3700. The memory 3704 and the processor 3702 also may include computer-readable media as discussed above.

The present disclosure contemplates a computer-readable medium 3722 that includes instructions 3724 or receives and executes instructions 3724 responsive to a propagated signal; so that a device connected to a network 3720 may communicate voice, video, audio, images or any other data over the network 3720. The instructions 3724 may be implemented with hardware, software and/or firmware, or any combination thereof. Further, the instructions 3724 may be transmitted or received over the network 3720 via a communication interface 3718. The communication interface 3718 may be a part of the processor 3702 or may be a separate component. The communication interface 3718 may be created in software or may be a physical connection in hardware. The communication interface 3718 may be configured to connect with a network 3720, external media, the display 3714, or any other components in system 3700, or combinations thereof. The connection with the network 3720 may be a physical connection, such as a wired Ethernet connection or may be established wirelessly as discussed below. Likewise, the additional connections with other components of the system 3700 may be physical connections or may be established wirelessly.

The network 3720 may include wired networks, wireless networks, or combinations thereof. The wireless network may be a cellular telephone network, an 802.11, 802.16, 802.20, or WiMax network. Further, the network 3720 may be a public network, such as the Internet, a private network, such as an intranet, or combinations thereof, and may utilize a variety of networking protocols now available or later developed including, but not limited to TCP/IP based networking protocols.

The computer-readable medium 3722 may be a single medium, or the computer-readable medium 3722 may be a single medium or multiple media, such as a centralized or distributed database, and/or associated caches and servers that store one or more sets of instructions. The term "computer-readable medium" may also include any medium that may be capable of storing, encoding or carrying a set of instructions for execution by a processor or that may cause a computer system to perform any one or more of the methods or operations disclosed herein.

The computer-readable medium 3722 may include a solid-state memory such as a memory card or other package that houses one or more non-volatile read-only memories. The computer-readable medium 3722 also may be a random access memory or other volatile re-writable memory. Additionally, the computer-readable medium 3722 may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that may be a tangible storage medium. Accordingly, the disclosure may be considered to include any one or more of a computer-readable medium or a distribution medium and other equivalents and successor media, in which data or instructions may be stored.

Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

The methods described herein may be implemented by software programs executable by a computer system. Further, implementations may include distributed processing, component/object distributed processing, and parallel processing. Alternatively or in addition, virtual computer system processing maybe constructed to implement one or more of the methods or functionality as described herein.

Although components and functions are described that may be implemented in particular embodiments with reference to particular standards and protocols, the components and functions are not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

CONCLUSION

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for creating a planing hull model based on absolute dimensions provided by a user, the method comprising:
    performing the following in a processor of a computer:
        receiving, from the user, the absolute dimensions of a plurality of hull sections, including two non-adjacent hull sections, the two non-adjacent hull sections having section curves that are distinct from each other, at least one section curve of the section curves being non-fair;
        generating a delta curve based on the absolute dimensions of the plurality of hull sections received from the user, wherein the planing hull model has an inner chine and a keel, and wherein the delta curve extends diagonally from the inner chine to the keel;
        interpolating interpolated dimensions of at least one hull section between the two non-adjacent hull sections;
        generating curves of a hull based on the absolute dimensions of the plurality of hull sections received from the user and the interpolated dimensions of the at least one hull section between the two non-adjacent hull sections;
        creating surfaces of the hull based on the generated curves and the delta curve, wherein the surfaces created include a running surface, and wherein the running surface is created to be continuous and fair; and
        generating and displaying a planing hull model from the created surfaces, wherein the planing hull model has the absolute dimensions provided by the user.

2. The method of claim 1, further comprising repeating the method with one or more different absolute dimensions received from the user, and dynamically adjusting the planing hull model being displayed based on the one or more different absolute dimensions.

3. The method of claim 1, wherein the generated curves include one or more of the following: an inner chine curve, an outer chine curve, an inner secondary chine curve, an outer secondary chine curve, a sheerline curve, a keel curve, and a delta curve.

4. The method of claim 1, further comprising including one or more of the following inputs in generating the curve of the hull: a bow shape parameter, a forefoot shape parameter, and a convexity parameter of an embodiment.

5. The method of claim 1, further comprising providing one or more of the following: a display of a planing area (Ap), a display of a planing area centroid (cAp), a display of all sections of the hull, a display of a buttocks, a display of a stem rake, and an offsets file output.

6. The method of claim 1, further comprising receiving, from the user with the absolute dimensions, a length of a hull, a chine length, and a chine height, and identifying where the plurality of hull sections are located along the hull from the length of the hull, the chine length, and the chine height.

7. The method of claim 1, wherein the plurality of hull sections is at least three hull sections.

8. The method of claim 7, wherein the hull extends from a bow to a transom with a midship therebetween and is characterized by hull sections 0-10, and wherein the absolute dimensions of the hull sections 0, 5, and 9 are received from the user, wherein the hull section 0 corresponds to the transom, wherein the hull section 5 corresponds to the midship, and wherein the hull section 9 is closer to the bow than to the midship.

9. The method of claim 8, wherein interpolated dimensions of the hull sections 2 and 4 are interpolated from the absolute dimensions of the hull sections 0, 5, and 9, and wherein the hull sections 2 and 4 are non-adjacent and are between the hull section 0 and the hull section 5.

10. The method of claim 9, wherein the interpolated dimensions of the hull section 10 are interpolated from the absolute dimensions of the hull sections 0, 5, and 9, wherein the hull section 10 is closer than the hull section 9 to the bow, and wherein the curves of the hull are generated from the absolute dimensions of the hull sections 0, 5, and 9 from the interpolated dimensions of the hull sections 2, 4, and 10.

11. A computer-readable medium storing computer-readable program code, wherein the computer-readable program code is configured to perform the following when executed by a processor of a computer, based on absolute dimensions provided by a user:
receive, from the user, the absolute dimensions of a plurality of hull sections, including two non-adjacent hull sections, the two non-adjacent hull sections having section curves that are distinct from each other, at least one section curve of the section curves being non-fair;
generating a delta curve based on the absolute dimensions of the plurality of hull sections received from the user, wherein the planing hull model has an inner chine and a keel, and wherein the delta curve extends diagonally from the inner chine to the keel;
interpolate interpolated dimensions of at least one hull section between the two non-adjacent hull sections;
generate curves of a hull based on the absolute dimensions of the plurality of hull sections received from the user and the interpolated dimensions of the at least one hull section between the two non-adjacent hull sections;
create surfaces of the hull based on the generated curves and the delta curve, wherein the surfaces created include a running surface, and wherein the running surface is created to be continuous and fair; and
generate and display a planing hull model from the created surfaces, wherein the planing hull model has the absolute dimensions provided by the user.

12. The computer-readable medium of claim 11, wherein the computer-readable program code is further configured to, when executed by a processor of a computer, dynamically adjust the planing hull model being displayed based on the one or more different absolute dimensions.

13. The computer-readable medium of claim 11, wherein the generated curves include one or more of the following: an inner chine curve, an outer chine curve, an inner secondary chine curve, an outer secondary chine curve, a sheerline curve, a keel curve, and a delta curve.

14. The computer-readable medium of claim 11, wherein the computer-readable program code is further configured to, when executed by a processor of a computer, include one or more of the following inputs in generating the curve of the hull: a bow shape parameter, a forefoot shape parameter, and a convexity parameter of an embodiment.

15. The computer-readable medium of claim 11, wherein the computer-readable program code is further configured to, when executed by a processor of a computer, provide one or more of the following: a display of a planing area (Ap), a display of a planing area centroid (cAp), a display of all sections of the hull, a display of a buttocks, a display of a stem rake, and an offsets file output.

16. The computer-readable medium of claim 11, wherein the computer-readable program code is further configured to, when executed by a processor of a computer, receive, from the user within the absolute dimensions, a length of a hull, a chine length, and a chine height, and identify where the plurality of hull sections are located along the hull from the length of the hull, the chine length, and the chine height.

17. The computer-readable medium of claim 11, wherein the plurality of hull sections is at least three hull sections.

18. The computer-readable medium of claim 17, wherein the hull extends from a bow to a transom with a midship therebetween and is characterized by hull sections 0-10, and wherein the absolute dimensions of hull sections 0, 5, and 9 are received from the user, wherein the hull section 0 corresponds to the transom, wherein the hull section 5 corresponds to the midship, and wherein the hull section 9 is closer to the bow than to the midship.

19. The computer-readable medium of claim 18, wherein interpolated dimensions of the hull sections 2 and 4 are interpolated from the absolute dimensions of the hull sections 0, 5, and 9, and wherein the hull sections 2 and 4 are non-adjacent and are between the hull section 0 and hull section 5.

20. The computer-readable medium of claim 19, wherein interpolated dimensions of the hull section 10 are interpolated from the absolute dimensions of the hull sections 0, 5, and 9, wherein the hull section 10 is closer than the hull section 9 to the bow, wherein the curves of the hull are generated from the absolute dimensions of the hull sections 0, 5, and 9 and from the interpolated dimensions of hull sections 2, 4, and 10.

21. A method for creating a planing hull model for building a planning hull based on absolute dimensions provided by a user, the method comprising:
performing the following in a processor of a computer:
receiving, from the user, the absolute dimensions of a plurality of hull sections, including two non-adjacent hull sections, the two non-adjacent hull sections having section curves that are distinct from each other, at least one section curve of the section curves being non-fair;
generating a delta curve based on the absolute dimensions of the plurality of hull sections received from the user, wherein the planing hull model has an inner chine and a keel, and wherein the delta curve extends diagonally from the inner chine to the keel;
interpolating interpolated dimensions of at least one hull section between the two non-adjacent hull sections;
generating curves of a hull based on the absolute dimensions of the plurality of hull sections received from the user and the interpolated dimensions of the at least one hull section between the two non-adjacent hull sections;
creating surfaces of the hull based on the generated curves and the delta curve, wherein the surfaces created include a running surface, and wherein the running surface is created to be continuous and fair;
generating and displaying a planing hull model from the created surfaces, wherein the planing hull model has the absolute dimensions provided by the user; and
constructing a planning hull based on the planning hull model.

* * * * *